US009365929B2

(12) United States Patent
Dassel et al.

(10) Patent No.: US 9,365,929 B2
(45) Date of Patent: Jun. 14, 2016

(54) MECHANICALLY FLUIDIZED SILICON DEPOSITION SYSTEMS AND METHODS

(71) Applicant: Rokstar Technologies LLC, Indianola, WA (US)

(72) Inventors: Mark W. Dassel, Indianola, WA (US); David A. Bressler, Indianola, WA (US)

(73) Assignee: ROKSTAR TECHNOLOGIES LLC, Indianola, WA (US)

( * ) Notice: Subject to any disclaimer, the term of this patent is extended or adjusted under 35 U.S.C. 154(b) by 0 days.

(21) Appl. No.: 14/497,107

(22) Filed: Sep. 25, 2014

(65) Prior Publication Data

US 2015/0010702 A1     Jan. 8, 2015

Related U.S. Application Data

(63) Continuation of application No. 13/481,548, filed on May 25, 2012, now Pat. No. 8,871,153.

(51) Int. Cl.
| | |
|---|---|
| C23C 16/44 | (2006.01) |
| C23C 16/46 | (2006.01) |
| B01J 8/18 | (2006.01) |

(Continued)

(52) U.S. Cl.
CPC ............ *C23C 16/4417* (2013.01); *B01J 8/003* (2013.01); *B01J 8/1809* (2013.01); *B01J 8/1872* (2013.01); *B01J 8/30* (2013.01); *B01J 8/40* (2013.01); *C01B 33/029* (2013.01); *C23C 16/24* (2013.01); *C23C 16/442* (2013.01); *C23C 16/45589* (2013.01); *C23C 16/46* (2013.01); *C23C 16/52* (2013.01); *B01J 2208/0007* (2013.01); *B01J 2208/00061* (2013.01); *B01J 2208/00176* (2013.01); *B01J 2208/00522* (2013.01); *B01J 2208/00539* (2013.01); *B01J 2208/00672* (2013.01); *B01J 2208/00761* (2013.01);

(Continued)

(58) Field of Classification Search
CPC ............. B01J 8/40; B01J 8/42; B01J 8/1872; C23C 16/4417; C23C 16/442
See application file for complete search history.

(56) References Cited

U.S. PATENT DOCUMENTS

| | | | | |
|---|---|---|---|---|
| 2,369,478 A | * | 2/1945 | Mekler et al. | .......... B01J 8/0257 34/195 |
| 2,856,273 A | | 10/1958 | Beber et al. | |

(Continued)

FOREIGN PATENT DOCUMENTS

| | | |
|---|---|---|
| JP | 52-136831 A | 11/1977 |
| JP | 54-6892 A | 1/1979 |

(Continued)

OTHER PUBLICATIONS

Japanese Office Action dated Jun. 1, 2015, for corresponding JP Application No. 2013-532836, 6 pages. (with English Translation).

(Continued)

*Primary Examiner* — Lessanework Seifu
(74) *Attorney, Agent, or Firm* — Seed IP Law Group PLLC

(57) ABSTRACT

Mechanically fluidized systems and processes allow for efficient, cost-effective production of silicon. Particulate may be provided to a heated tray or pan, which is oscillated or vibrated to provide a reaction surface. The particulate migrates downward in the tray or pan and the reactant product migrates upward in the tray or pan as the reactant product reaches a desired state. Exhausted gases may be recycled.

49 Claims, 4 Drawing Sheets

(51) Int. Cl.
| | |
|---|---|
| *B01J 8/40* | (2006.01) |
| *C23C 16/442* | (2006.01) |
| *C23C 16/24* | (2006.01) |
| *C23C 16/455* | (2006.01) |
| *C01B 33/029* | (2006.01) |
| *B01J 8/30* | (2006.01) |
| *B01J 8/00* | (2006.01) |
| *C23C 16/52* | (2006.01) |

(52) U.S. Cl.
CPC ............... *B01J2208/00769* (2013.01); *B01J 2219/00191* (2013.01)

(56) References Cited

U.S. PATENT DOCUMENTS

| | | | |
|---|---|---|---|
| 3,011,877 | A | 12/1961 | Schweickert et al. |
| 3,099,534 | A | 7/1963 | Schweickert et al. |
| 3,147,141 | A | 9/1964 | Ishizuka |
| 3,161,483 | A | 12/1964 | Morris |
| 3,585,268 | A | 6/1971 | Monks et al. |
| 3,640,767 | A | 2/1972 | Fulton et al. |
| 3,963,838 | A | 6/1976 | Setty et al. |
| 4,150,168 | A | 4/1979 | Yatsurugi et al. |
| 4,179,530 | A | 12/1979 | Köppl et al. |
| 4,271,783 | A | 6/1981 | Lupinski et al. |
| 4,311,545 | A | 1/1982 | Bugl et al. |
| 4,354,987 | A | 10/1982 | Iya |
| 4,440,108 | A | 4/1984 | Little et al. |
| 4,543,399 | A | 9/1985 | Jenkins, III et al. |
| 4,606,941 | A | 8/1986 | Jenkin |
| 4,615,993 | A | 10/1986 | Schirrmacher et al. |
| 4,628,838 | A | 12/1986 | Love |
| 5,118,485 | A | 6/1992 | Arvidson et al. |
| 5,298,296 | A | 3/1994 | Kojima et al. |
| 6,190,625 | B1 | 2/2001 | Jha et al. |
| 7,902,104 | B2 | 3/2011 | Kalck et al. |
| 2005/0259061 | A1 | 11/2005 | Aoki |
| 2012/0085284 | A1 | 4/2012 | Dassel |
| 2013/0316077 | A1 | 11/2013 | Dassel et al. |

FOREIGN PATENT DOCUMENTS

| | | | |
|---|---|---|---|
| JP | 59-115736 | A | 7/1984 |
| JP | 62-197155 | A | 8/1987 |
| JP | 63-270394 | A | 11/1988 |
| JP | 64-14194 | A | 1/1989 |
| JP | 1-188497 | A | 7/1989 |
| JP | 5-246786 | A | 9/1993 |
| JP | 06-003866 | A | 1/1994 |
| JP | 6-127924 | A | 5/1994 |
| JP | 6-177056 | A | 6/1994 |
| JP | 2001-524603 | A | 12/2001 |
| JP | 2006-3866 | A | 1/2006 |
| JP | 10-2007-0048169 | A | 5/2007 |

OTHER PUBLICATIONS

Chinese Office Action with partial English Translation, issued Jan. 4, 2015, for corresponding Chinese Application No. 201180048337.4, 13 pages.

Eurasian Office Action mailed Dec. 1, 2014, for EA Application No. 201370086/31, 2 pages.

English Translation of Eurasian Office Action mailed Dec. 1, 2014, for EA Application No. 201370086/31, 2 pages.

Chinese Office Action, issued Jun. 17, 2014, for corresponding Chinese Application No. 201180048337.4, 13 pages. (with English Translation).

Dassel, "Mechanically Fluidized Reactor Systems and Methods, Suitable for Production of Silicon," Preliminary Amendment filed Nov. 1, 2011, for U.S. Appl. No. 13/247,354, 7 pages.

Dassel, "Mechanically Fluidized Reactor Systems and Methods, Suitable for Production of Silicon," Office Action mailed Apr. 8, 2014, for U.S. Appl. No. 13/247,354, 22 pages.

Dassel, "Mechanically Fluidized Reactor Systems and Methods, Suitable for Production of Silicon," Amendment filed Aug. 8, 2014, for U.S. Appl. No. 13/247,354, 22 pages.

Dassel, "Mechanically Fluidized Reactor Systems and Methods, Suitable for Production of Silicon," Office Action mailed Sep. 25, 2014, for U.S. Appl. No. 13/247,354, 59 pages.

Dassel et al., "Mechanically Fluidized Silicon Deposition Systems and Methods," Office Action mailed Mar. 20, 2014, for U.S. Appl. No. 13/481,548, 10 pages.

Dassel et al., "Mechanically Fluidized Silicon Deposition Systems and Methods," Amendment filed Jun. 17, 2014, for U.S. Appl. No. 13/481,548, 25 pages.

Dassel et al., "Mechanically Fluidized Silicon Deposition Systems and Methods," Notice of Allowance mailed Jun. 25, 2014, for U.S. Appl. No. 13/481,548, 7 pages.

International Search Report and Written Opinion, mailed Aug. 13, 2013, for PCT/US2013/040398, 10 pages.

International Search Report, mailed Apr. 13, 2012, for PCT/US2011/053675, 3 pages.

Written Opinion, mailed Apr. 13, 2012, for PCT/US2011/053675, 6 pages.

Chinese Office Action dated Jun. 30, 2015, for corresponding CN Application No. 201180048337.4, 6 pages.

Eurasian Office Action, for Application No. 201370086/31, dated Dec. 1, 2015, 6 pages. (with English Translation).

Dassel, "Mechanically Fluidized Reactor Systems and Methods, Suitable for Production of Silicon," Office Action mailed Oct. 15, 2015, for U.S. Appl. No. 13/247,354, 26 pages.

Ukrainian Office Action with English Translation, for corresponding UA Application No. a 2013 05736, 10 pages.

Chinese Office Action, dated Mar. 22, 2016, for corresponding CN Application No. 201380036496.1, with English Translation, 8 pages.

Malaysian Office Action, mailed Apr. 29, 2016 for corresponding MY Application No. PI 2013001225, 4 pages.

Supplementary European Search Report, dated Jan. 29, 2016, for corresponding European Application No. 13794694.3—1371/2855006, 11 pages.

* cited by examiner

MECHANICALLY FLUIDIZED SILICON DEPOSITION SYSTEMS AND METHODS

TECHNICAL FIELD

This disclosure generally relates to mechanically fluidized reactors, which may be suitable for the production of silicon, e.g., polysilicon, for example via chemical vapor deposition.

BACKGROUND

Silicon, specifically polysilicon, is a basic material from which a large variety of semiconductor products are made. Silicon forms the foundation of many integrated circuit technologies, as well as photovoltaic transducers. Of particular industry interest is high purity silicon.

Processes for producing polysilicon may be carried out in different types of reaction devices, including chemical vapor deposition reactors and fluidized bed reactors. Various aspects of the chemical vapor deposition (CVD) process, in particular the Siemens or "hot wire" process, have been described, for example in a variety of U.S. patents or published applications (see, e.g., U.S. Pat. Nos. 3,011,877; 3,099,534; 3,147,141; 4,150,168; 4,179,530; 4,311,545; and 5,118,485).

Silane and trichlorosilane are both used as feed materials for the production of polysilicon. Silane is more readily available as a high purity feedstock because it is easier to purify than trichlorosilane. Production of trichlorosilane introduces boron and phosphorus impurities, which are difficult to remove because they tend to have boiling points that are close to the boiling point of trichlorosilane itself. Although both silane and trichlorosilane are used as feedstock in Siemens-type chemical vapor deposition reactors, trichlorosilane is more commonly used in such reactors. Silane, on the other hand, is a more commonly used feedstock for production of polysilicon in fluidized bed reactors.

Silane has drawbacks when used as a feedstock for either chemical vapor deposition or fluidized bed reactors. Producing polysilicon from silane in a Siemens-type chemical vapor deposition reactor may require up to twice the electrical energy compared to producing polysilicon from trichlorosilane in such a reactor. Further, the capital costs are high because a Siemens-type chemical vapor deposition reactor yields only about half as much polysilicon from silane as from trichlorosilane. Thus, any advantages resulting from higher purity of silane are offset by higher capital and operating costs in producing polysilicon from silane in a Siemens-type chemical vapor deposition reactor. This has led to the common use of trichlorosilane as feed material for production of polysilicon in such reactors.

Silane as feedstock for production of polysilicon in a fluidized bed reactor has advantages regarding electrical energy usage compared to production in Siemens-type chemical vapor deposition reactors. However, there are disadvantages that offset the operating cost advantages. In using the fluidized bed reactor, the process itself may result in a lower quality polysilicon product even though the purity of the feedstock is high. For example, polysilicon produced in a fluidized bed reactor may also include metal impurities from the equipment used in providing the fluidized bed due to the typically abrasive conditions found within a fluidized bed. Further, polysilicon dust may be formed, which may interfere with operation by forming ultra-fine particulate material within the reactor and may also decrease the overall yield. Further, polysilicon produced in a fluidized bed reactor may contain residual hydrogen gas, which must be removed by subsequent processing. Thus, although high purity silane may be available, the use of high purity silane as a feedstock for the production of polysilicon in either type of reactor may be limited by the disadvantages noted.

Chemical vapor deposition reactors may be used to convert a first chemical species, present in vapor or gaseous form, to solid material. The deposition may and commonly does involve the conversion or decomposition of the first chemical species to one or more second chemical species, one of which second chemical species is a substantially non-volatile species.

Decomposition and deposition of the second chemical species on a substrate is induced by heating the substrate to a temperature at which the first chemical species decomposes on contact with the substrate to provide one or more of the aforementioned second chemical species, one of which second chemical species is a substantially non-volatile species. Solids so formed and deposited may be in the form of successive annular layers deposited on bulk forms, such as immobile rods, or deposited on mobile substrates, such as beads, grains, or other similar particulate matter chemically and structurally suitable for use as a substrate.

Beads are currently produced, or grown, in a fluidized bed reactor where an accumulation of dust, comprised of the desired product of the decomposition reaction, acting as seeds for additional growth, and pre-formed beads, also comprised of the desired product of the decomposition reaction, are suspended in a gas stream passing through the fluidized bed reactor. Due to the high gas volumes needed to fluidize the bed within a fluidized bed reactor, where the volume of the gas containing the first chemical species is insufficient to fluidize the bed within the reactor, a supplemental fluidizing gas such as an inert or marginally reactive gas is used to provide the gas volume necessary to fluidize the bed. As an inert or only marginally reactive gas, the ratio of the gas containing the first chemical species to the supplemental fluidizing gas may be used to control or otherwise limit the reaction rate within or the product matrix provided by the fluidized bed reactor.

The use of a supplemental fluidizing gas however can increase the size of process equipment and also increases separation and treatment costs to separate any unreacted or decomposed first chemical species present in the gas exiting the fluidized bed reactor from the supplemental gas used within the fluidized bed reactor.

In a conventional fluidized bed reactor, silane and one or more diluents such as hydrogen are used to fluidize the bed. Since the fluidized bed temperature is maintained at a level sufficient to thermally decompose silane, the gases used to fluidize the bed, due to intimate contact with the bed, are necessarily heated to the same bed temperature. For example, silane gas fed to a fluidized bed reactor operating at a temperature exceeding 500° C. is itself heated to its auto-decomposition temperature. This heating causes some of the silane gas to undergo spontaneous thermal decomposition which creates an extremely fine (e.g., having a particle diameter of 0.1 micron or less) silicon powder that is often referred to as "amorphous dust" or "poly-powder." Silane forming poly-powder instead of the preferred polysilicon deposition on a substrate represents lost yield and unfavorably impacts production economics. The very fine poly-powder is electrostatic and is fairly difficult to separate from product particles for removal from the system. Additionally, if the poly-powder is not separated, off-specification polysilicon granules (i.e., polysilicon granules having a particle size less than the desired diameter of about 1.5 mm) are formed, further eroding yield and further unfavorably impacting production economics.

In some instances, a silane yield loss to poly-powder is on the order of about 1%, but may range from about 0.5% to about 5%. The average poly-powder particle size is typically about 0.1 micron, but can range from about 0.05 microns to about 1 micron. A 1% yield loss can therefore create around $1 \times 10^{16}$ poly-powder particles. Unless these fine poly-powder particles are removed from the fluidized bed, the poly-powder will provide particles having only $\frac{1}{3,000}^{th}$ of the industry desired diameter of 1.5 mm. Thus the ability to efficiently remove ultra-fine particles from the fluidized bed or from the fluid bed reactor off-gas is important. However, electrostatic forces often hinder filtering the ultra-fine poly-powder from a finished product or fluid bed reactor off-gas. Therefore, processes that minimize or ideally avoid the formation of the ultra-fine poly-powder are quite advantageous.

BRIEF SUMMARY

A mechanically fluidized reactor may be summarized as including a housing having a chamber therein; a pan received in the chamber of the housing for movement therein, the pan having a lower surface, an upper surface, a perimeter, and a perimeter wall that extends upward relative to the upper surface at least partially about of the perimeter of the pan; a transmission including at least one oscillatory transmission member coupled to oscillate the pan to mechanically fluidize a particulate bed carried by the upper surface of the pan; at least one bushing having a passage through which the at least one transmission member passes, and which constrains the at least one transmission member to oscillatory axial movement along a single axis; and a heater thermally conductively coupled to provide heat to the upper surface of the pan to conductively transfer thermal energy to the particulate bed.

The single axis may be oriented normally to the upper surface of the pan. The at least one bushing may include a first bushing having a first bushing passage and a second bushing having a second bushing passage, the second bushing passage axially aligned with the first bushing passage, and the second bushing spaced relatively apart from the first bushing. The mechanically fluidized reactor may further include a boot that surrounds at least one of the first or the second bushings to retain any finings or contaminants created by the oscillatory motion of the at least one transmission member. The pan may include at least one of: a steel alloy, a stainless steel alloy, a nickel alloy, and a graphite alloy; and may further include a layer comprising at least one of: quartz, silicide, silicon carbide, or the like. Silicon carbide, for example, is durable and reduces the tendency of metal ions such as nickel, chrome, and iron to migrate from the pan to the polysilicon coated particles. The pan may include a 316 steel alloy and may further include a silicide layer on at least a portion of the upper surface of the pan. The mechanically fluidized reactor may further include an electrical charge generator electrically coupled to the pan to create an electrostatic charge on the pan, the electrostatic charge sufficient to attract at least a portion of the particles in the mechanically fluidized particulate bed having a diameter less than an arithmetic mean particle diameter of the particles forming the mechanically fluidized particulate bed. The mechanically fluidized reactor may further include a flexible membrane that apportions the chamber into an upper portion to which the upper surface of the pan is exposed and a lower portion to which the lower surface of the pan is exposed; an inert gas inlet fluidly coupled to the lower portion of the chamber to receive an inert gas into the lower portion of the chamber; a particulate inlet fluidly coupled to the upper portion of the chamber to receive and deposit a depth of particulates on the interior surface of the pan to form the particulate bed thereupon; and a gas inlet fluidly coupled to the upper portion of the chamber to receive a gas including at least a first chemical species into the upper portion of the chamber. The gas including the first chemical species and a diluent are added to the upper portion of the chamber to form a bulk gas mixture having a temperature less than the auto-decomposition temperature of the first chemical species, for example less than about 600° C. The mechanically fluidized reactor may further include at least one fan at least partially disposed within the upper portion of the chamber to circulate the gas including at least the first chemical species within the upper portion of the chamber. The mechanically fluidized reactor may further include at least one surface feature disposed on an exterior surface of the housing and thermally conductively coupled to the housing proximate the upper portion of the chamber to transfer thermal energy from the upper portion of the chamber to a coolant proximate the exterior surface of the housing. The particulate bed may include a plurality of particles, each having a respective a particle surface area, the sum of the particle surface areas of the particles forming the particulate bed define an aggregate bed surface area, the upper surface of the pan defines a pan surface area; and a ratio of the aggregate bed surface area to the pan surface area is greater than about 10:1. The heater may raise a temperature of the mechanically fluidized particulate bed to at least 400° C. The gas including the first chemical species may be intermittently added to the upper portion of the chamber and contacted with the mechanically fluidized particulate bed; wherein at least a portion of the first chemical species thermally decomposes to deposit a polysilicon layer on at least a portion of the particles in the mechanically fluidized bed particulate bed; and wherein the portion of the particles in the mechanically fluidized particulate bed having the polysilicon layer are intermittently removed from the pan. In the case of intermittent gas addition, a conversion of the first chemical species may be at least about 95%; and wherein the conversion of the first chemical species may be measured as a mass of silicon deposited in the polysilicon layer on the particles as a percentage of a mass of silicon present in the first chemical species received in the upper portion of the chamber. Gas including the first chemical species may be added continuously to the upper portion of the chamber and contacted with the mechanically fluidized particulate bed; wherein at least a portion of the first chemical species thermally decomposes to deposit a polysilicon layer on at least a portion of the particles forming the mechanically fluidized particulate bed; and wherein the portion of the particles in the mechanically fluidized particulate bed having the polysilicon layer are continuously removed from the pan. In the case of continuous gas addition, the conversion of the first chemical species may be at least about 70%; and wherein the conversion of the first chemical species may be measured as a mass of silicon deposited in the polysilicon layer on the particles as a percentage of a mass of silicon present in the first chemical species received in the upper portion of the chamber. Within the particulate bed, a Gaussian particle size distribution is typically formed. The oscillatory or vibratory motion of the particulate bed assists in the classifying particles by size. Larger diameter particles will tend to rise or "float" towards the surface of the particulate bed, while smaller diameter particles will tend to descend or "sink" towards the bottom of the particulate bed. The portion of particles having the polysilicon layer that are continuously removed from the particulate bed may be adjusted by adjusting the depth of the mechanically fluidized particulate bed. The mechanically fluidized reactor may further include a hollow member projecting vertically through the pan into the mechanically fluidized particulate bed contained therein; wherein the depth of the mechanically fluidized particulate bed is based at least in part on the vertical projection of the hollow member into the mechanically fluidized particulate bed. The mechanically fluidized reactor may further include a thermally reflective member disposed in the upper portion of the chamber and proximate the mechanically fluidized particulate bed, the thermally reflective member to return at least a portion of the thermal energy radiated by the mechanically fluidized particulate bed back to the mechanically fluidized particulate bed. At least a portion of the gas including the first chemical species received into the upper portion of the chamber may pass over at least a portion of the thermally reflective member to maintain the thermally reflective member at a temperature of less than 400° C. The inert gas received by the lower portion of the chamber may be at a temperature of less than 400° C. The lower portion of the chamber may be maintained at a pressure greater than a pressure maintained in the upper portion of the chamber. The mechanically fluidized reactor may further include a detector responsive to the inert gas in the lower portion of the chamber to detect leakage of the inert gas from the lower portion of the chamber. In at least some instances, the detector may be placed inside the upper chamber of the vessel. The inert gas received by the lower portion of the chamber may include at least one of: nitrogen, helium, and argon. The first chemical species received by the upper portion of the chamber may include at least one of: silane, dichlorosilane, trichlorosilane, or tetrachlorosilane. The mechanically fluidized reactor may further include at least one controller to control the oscillatory motion of the pan; wherein the controller successively causes the operation of the actuator to mechanically fluidize the particulate bed for a first period of time and ceases the operation of the actuator to settle the particulate bed for a second period of time; and wherein a ratio of the first period of time to the second period of time is greater than about 1:1.

A mechanically fluidized reactor may be summarized as including a housing having a chamber therein; a pan received in the chamber of the housing for movement therein, the pan having a lower surface, an upper surface, a perimeter, and a perimeter wall that extends upward relative to the upper surface at least partially about the perimeter of the pan; a transmission including at least one oscillatory transmission member coupled to oscillate the pan to mechanically fluidize a particulate bed carried by the upper surface of the pan; a flexible membrane that apportions the chamber into an upper portion to which the upper surface of the pan is exposed and a lower portion to which the lower surface of the pan is exposed; a pressure device responsive to a pressure difference between a pressure in the upper portion of the chamber and a pressure in the lower portion of the chamber; an inert gas inlet fluidly coupled to the lower portion of the chamber to receive an inert gas into the lower portion of the chamber; a particulate inlet fluidly coupled to the upper portion of the chamber to receive and deposit a depth of particulates on the upper surface of the pan to form the particulate bed thereupon; a gas inlet fluidly coupled to the upper portion of the chamber to receive a gas including at least a first chemical species into the upper portion of the chamber; and a heater thermally conductively coupled to the open top pan to conductively transfer thermal energy to the mechanically fluidized particulate bed.

The pressure device may further maintain a difference in pressure of less than about 5 pounds per square inch gauge (psig) between the measured pressure in the upper portion of the chamber and the measured pressure in the lower portion of the chamber. The mechanically fluidized reactor may further include at least one gas circulating device at least partially disposed within the upper portion of the chamber and operable to circulate the gas including at least the first chemical species within the upper portion of the chamber. The particulate bed may include a plurality of particles, each particle having a respective particle surface area; wherein the sum of the particle surface areas defines an aggregate bed surface area; wherein the upper surface of the pan defines a pan surface area; and wherein the ratio of the aggregate bed surface area to the pan surface area is greater than about 10:1. A temperature of the particles forming the mechanically fluidized particulate bed may be increased to at least 400° C. using the heater. Gas including the first chemical species may be added continuously to the upper portion of the chamber and contacted with the mechanically fluidized particulate bed; wherein at least a portion of the first chemical species thermally decomposes to deposit a polysilicon layer on at least a portion of the particles forming the mechanically fluidized particulate bed; and wherein the portion of the particles in the mechanically fluidized particulate bed having the polysilicon layer are continuously removed from the pan. The conversion of the first chemical species may be at least about 95%, the conversion of the first chemical species measured as a percentage of a mass of silicon in the first chemical species received in the upper portion of the chamber that is deposited in the polysilicon layer on the particles. The portion of particles having the polysilicon layer that are continuously removed from the particulate bed may be adjusted by adjusting the depth of the mechanically fluidized particulate bed. The mechanically fluidized reactor may further include a hollow member projecting vertically through the pan into the mechanically fluidized particulate bed contained therein; and wherein the depth of the mechanically fluidized particulate bed is based at least in part on the vertical projection of the hollow member into the mechanically fluidized particulate bed. The mechanically fluidized reactor may further include a thermal member disposed in the upper portion of the chamber and proximate the mechanically fluidized particulate bed to reflect at least a portion of the thermal energy radiated by the mechanically fluidized particulate bed back into the mechanically fluidized particulate bed.

A method of operation of a mechanically fluidized reactor may be summarized as including physically displacing a pan having a lower surface, an upper surface, a perimeter, and a perimeter wall that extends upward relative to the upper surface at least partially about of the perimeter of the pan via a transmission including at least one transmission member operably coupled to the pan, the actuator to physically displace the open top pan along an oscillatory motion path defined by a bidirectional motion along a single axis normal to at least a portion of the upper surface of the pan; flowing particles to the pan to provide a mechanically fluidized particulate bed including a plurality of particles in contact with the upper surface of the pan; heating the mechanically fluidized particulate bed to a temperature of greater than 400° C.; receiving a gas including a first chemical species in an upper portion of a chamber apportioned by a flexible membrane into the upper portion to which the upper surface of the pan is exposed and a lower portion to which the lower surface of the pan is exposed; circulating the gas within the upper portion of the chamber and through at least a portion of the mechanically fluidized particulate bed using at least one gas circulating device; thermally decomposing at least a portion of the first chemical species to form a second chemical species within the heated, mechanically fluidized particulate bed; depositing the second chemical species on an exterior surface of at least a portion of the particles forming the mechanically fluidized particulate bed, wherein the deposition of the second chemical species increases a diameter of the respective portion of the particles forming the mechanically fluidized particulate bed; and selectively separating from the mechanically fluidized particulate bed at least the portion of the particles having a diameter exceeding a threshold.

The method of operating a mechanically fluidized reactor may further include receiving an inert gas in the lower portion of the chamber; wherein a pressure exerted by the inert gas in the lower portion of the chamber exceeds a pressure exerted by the gas in the upper portion of the chamber. The method of operating a mechanically fluidized reactor may further include controlling to less than about 5 psig a difference in pressure between the lower portion of the chamber and the upper portion of the chamber. The method of operating a mechanically fluidized reactor may further include mechanically fluidizing the particulate bed for a first period of time; and halting the mechanical fluidization of the particulate bed for a second period of time; wherein a ratio of the first period of time to the second period of time is greater than about 1:1. The method of operating a mechanically fluidized reactor may further include controlling the temperature within the lower portion of the chamber to maintain a temperature within the lower portion of the chamber of from about 25° C. to about 375° C. Heating the mechanically fluidized particulate bed to a temperature of greater than 400° C. may include controlling the flow of electricity to one or more electrical heating elements thermally conductively coupled to the lower surface of the pan. The method of operating a mechanically fluidized reactor may further include electrostatically attracting to the pan at least a portion of the particles of a diameter less than an arithmetic mean particle diameter of the particles forming the mechanically fluidized particulate bed.

BRIEF DESCRIPTION OF SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements, as drawn, are not intended to convey any information regarding the actual shape of the particular elements, and have been solely selected for ease of recognition in the drawings.

DETAILED DESCRIPTION

Figure 1:
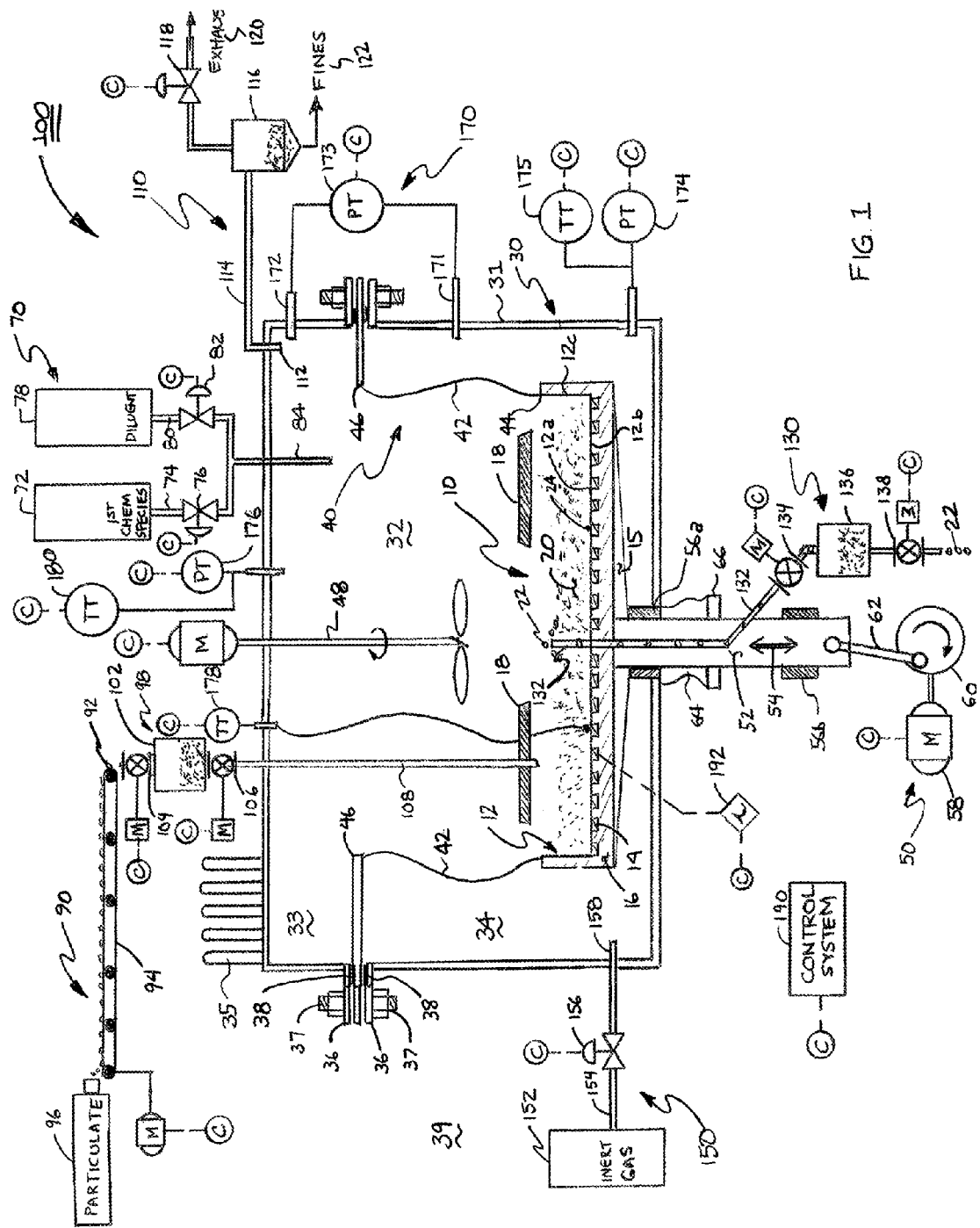
FIG. 1 is a partial sectional view of an example semi-batch mechanically fluidized deposition system including a housing, a particulate bed located in an upper portion of a chamber formed within the housing, a transmission system coupled to the particulate bed to mechanically fluidize the bed via oscillation or vibration along a single axis of motion, a gas supply subsystem to deliver a bulk gas mixture comprising a first chemical species and one or more diluent(s) to the upper portion of the chamber proximate the mechanically fluidized particulate bed, and various supply lines and output lines, according to an illustrated embodiment.

In the following description, certain specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with systems for making silicon including, but not limited to, vessel design and construction details, metallurgical properties, piping, control system design, mixer design, separators, vaporizers, valves, controllers, or final control elements, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment," or "an embodiment," or "another embodiment," or "some embodiments," or "certain embodiments" means that a particular referent feature, structure, or characteristic described in connection with the embodiment is included in at least one embodiment. Thus, the appearance of the phrases "in one embodiment," or "in an embodiment," or "in another embodiment," or "in some embodiments," or "in certain embodiments" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a chlorosilane includes a single species of chlorosilane, but may also include multiple species of chlorosilanes. It should also be noted that the term "or" is generally employed as including "and/or" unless the content clearly dictates otherwise.

As used herein, the term "silane" refers to $SiH_4$. As used herein, the term "silanes" is used generically to refer to silane and/or any derivatives thereof. As used herein, the term "chlorosilane" refers to a silane derivative wherein one or more of hydrogen has been substituted by chlorine. The term "chlorosilanes" refers to one or more species of chlorosilane. Chlorosilanes are exemplified by monochlorosilane ($SiH_3Cl$ or MCS); dichlorosilane ($SiH_2Cl_2$ or DCS); trichlorosilane ($SiHCl_3$ or TCS); or tetrachlorosilane, also referred to as silicon tetrachloride ($SiCl_4$ or STC). The melting point and boiling point of silanes increases with the number of chlorines in the molecule. Thus, for example, silane is a gas at standard temperature and pressure (0° C./273 K and 100 kPa), while silicon tetrachloride is a liquid. As used herein, the term "silicon" refers to atomic silicon, i.e., silicon having the formula Si. Unless otherwise specified, the terms "silicon" and "polysilicon" are used interchangeably herein when referring to the silicon product of the methods and systems disclosed herein. Unless otherwise specified, concentrations expressed herein as percentages should be understood to mean that the concentrations are in mole percent.

The headings provided herein are for convenience only and do not interpret the scope or meaning of the embodiments.

FIG. 1 shows a semi-batch mechanically fluidized bed reactor system 100, according to one illustrated embodiment. In the semi-batch mechanically fluidized bed reactor system 100, fresh particles 92 and a bulk gas mixture including controlled quantities of a first chemical species and one or more diluent(s) are intermittently introduced to an upper portion 33 of a chamber 32 within a reaction vessel 30. The particles form a mechanically fluidized particulate bed 20 which is heated via a heater 14 to a temperature in excess of the thermal decomposition temperature of the first chemical species. As the bulk gas mixture permeates the mechanically fluidized particulate bed 20, the thermal decomposition of the first chemical species within the particulate bed 20 deposits a second chemical species on the particles in the bed to form coated particles 22. Coated particles 22 are intermittently removed from the reaction vessel 30 via the coated particle collection subsystem 130.

The mechanically fluidized bed reactor system 100 includes a mechanically fluidized bed apparatus 10 that is useful in mechanically fluidizing particles, seeds, dust, grains, granules, beads, etc. (hereinafter collectively referred to as "particles" or "particulates" for clarity and conciseness), and in providing heat via a heater 14 to the mechanically fluidized particulate bed 20. The heated, mechanically fluidized particles in the particulate bed 20 are useful in providing a physical substrate upon which the second chemical species, such as polysilicon, is deposited by the thermal decomposition of the first chemical species such as silane, chlorosilane, or combinations thereof. The mechanically fluidized bed reactor system 100 may also include a chamber 32 in a reaction vessel 30 where the deposition of the second chemical species occurs, often at an elevated temperature and pressure (e.g., relative to atmospheric). One or more vessel walls 31 separate the chamber 32 from the vessel exterior 39. The reaction vessel 30 can feature either a unitary or multi-piece design. In one example shown in FIG. 1, the reaction vessel 30 is shown as a multi-piece vessel that is assembled using one or more fastener systems such as one or more flanges 36, threaded fasteners 37, and sealing members 38.

The mechanically fluidized bed apparatus 10 may be positioned in the chamber 32 in the reaction vessel 30. The system 100 further includes a transmission subsystem 50, a gas supply subsystem 70, a particle supply subsystem 90, a gas recovery subsystem 110, a coated particle collection subsystem 130, an inert gas feed subsystem 150, and a pressure subsystem 170. The system 100 may also include an automated or semi-automated control system 190 that is communicably coupled to the various components and subsystems forming the system. For clarity, the communicative coupling of various components to the control system 190 is depicted using a dashed line and "©" symbol. Each of these structures, systems or subsystems is discussed in subsequent detail below.

The chamber 32 within the reaction vessel 30 may be raised to or maintained at elevated temperatures or pressures relative to the vessel exterior environment 39. Thus, the vessel wall 31 is of suitable material, design, and construction with adequate safety margins to withstand the expected working pressures and temperatures within the chamber 32, which may include repeated pressure and thermal cycling of the reaction vessel 30. Additionally, the overall shape of the reaction vessel 30 may be selected or designed to withstand such expected working pressures or to accommodate a preferred particle bed 20 configuration or geometry. In at least some instances, the reaction vessel 30 may be fabricated in conformance with the American Society of Mechanical Engineers (ASME) Section VIII code (latest version) covering the construction of pressure vessels. In some instances, the design and construction of the reaction vessel 30 may accommodate the partial or complete disassembly of the vessel for operation, inspection, maintenance, or repair. Such disassembly may be facilitated by the use of threaded or flanged connections on the reaction vessel 30 itself or the fluid connections made to the reaction vessel 30.

The reaction vessel 30 may optionally include one or more surface features 35 on all or a portion of an exterior surface of the vessel wall 31. The surface features 35 may be integral with the vessel wall 31 or may be thermally conductively coupled to the vessel wall 31. Thermal energy is removed from the chamber 32 and in some instances dissipated to the exterior environment 39 via conductive transfer of the thermal energy from the chamber 32 through the vessel walls 31 to the one or more surface features 35. Although depicted as a series of cooling fins (only a few shown) providing an extended surface area for convective heat dissipation to the exterior environment 39 in FIG. 1, such surface features 35 may also include types, configurations, or combinations of other surface features, cooling jackets having one or more coolants circulated therein (not shown in FIG. 1 for clarity), or various combinations of surface features and cooling jackets. In some instances, the surface features 35 may be selectively disposed on portions of the chamber 32 or the reaction vessel 30 that are prone to localized concentrations of thermal energy to assist in the dissipation or distribution of such thermal energy.

The mechanically fluidized bed apparatus 10 includes at least one pan 12 having an upper surface 12a, a lower surface 12b and a perimeter wall 12c that extends at least partially about the upper surface 12a. The heater 14 provides thermal energy to a portion of at least the bottom surface of the pan 12b via a thermally conductive coupling to the pan 12. A transmission subsystem 50 is physically and operably coupled to the pan 12 via an oscillatory transmission member 52. Although the oscillatory transmission member 52 is shown attached to the bottom surface of the pan 12b in FIG. 1, the oscillatory transmission member 52 may be operably coupled to any surface of the pan 12. One or more stiffening members 15 may be disposed about the lower surface 12b or about other surfaces of the pan 12 to increase rigidity and reduce operational flexing of the pan 12. In some instances, the one or more stiffening members 15 may be disposed on the upper surface of the pan 12a to improve the rigidity of the pan 12, or to improve the fluidization or flow characteristics of the mechanically fluidized particulate bed 20.

The term "mechanically fluidized" as used herein and in the claims refers to the mechanical suspension or fluidization of particles forming the particulate bed 20, for example by oscillating or vibrating the particulate bed 20 in a manner promoting the flow and circulation (i.e., the "mechanical fluidization") of the particles. Mechanical fluidization, for example as generated by a physical displacement (e.g., vibration or oscillation) of the pan 12, is thus distinct from gaseous bed fluidization generated by the passage of a gas through the particulate bed. The terms "vibration" and "oscillation," and variations of such (e.g., vibrating, oscillating) are used interchangeably herein and in the claims.

While the pan 12 may have any shape or configuration, in at least some situations, the pan 12 has a generally circular shape with a diameter of from about 1 inch to about 120 inches; from about 1 inch to about 96 inches; from about 1 inch to about 72 inches; from about 1 inch to about 48 inches; from about 1 inch to about 24 inches; or from about 1 inch to about 12 inches. The perimeter wall of the pan 12c can extend in a generally perpendicularly from the upper surface of the pan 12a to a height greater than the depth of the mechanically fluidized particulate bed 20 to retain the bed on the upper surface 12a of the pan 12 during operation. In some instances, the height of the perimeter wall 12c may be set at a distance from the upper surface of the pan 12a such that a portion of the particulates forming the particulate bed 20 flow over the top of the perimeter wall for capture by the coated particle removal subsystem 130. The perimeter wall 12c can extend above the upper surface of the pan 12a by a distance of from about 0.25 inches to about 12 inches; from about 0.50 inches to about 10 inches; from about 0.75 inches to about 8 inches; from about 1 inch to about 6 inches; or from about 1 inch to about 3 inches.

The portions of the pan 12 contacting the mechanically fluidized particulate bed 20 are formed of an abrasion or erosion resistant material that is also resistant to chemical degradation by the first chemical species, the diluent(s), and the coated particles in the particulate bed 20. Use of a pan 12 having appropriate physical and chemical resistance reduces the likelihood of contamination of the fluidized particulate bed 20 by contaminants released from the pan 12. In at least some instances, the pan 12 can comprise an alloy such as a graphite alloy, a nickel alloy, a stainless steel alloy, or combinations thereof. A layer or coating of resilient material that resists abrasion or erosion, reduces unwanted product buildup, or reduces the likelihood of contamination of the mechanically fluidized particulate bed 20 may be deposited on all or a portion of the pan 12. In some instances, the layer or coating can include but is not limited to: a quartz layer, a silicide layer, or a silicon carbide layer. A Silicon carbide layer, for example, is durable and reduces the tendency of metal ions such as nickel, chrome, and iron from the metal comprising the pan to migrate into the polysilicon coated particles in the pan 12. In one example, the pan 12 comprises a 316 stainless steel pan with a silicide layer deposited on at least a portion of the upper surface 12a and the perimeter wall 12c that contact the mechanically fluidized particulate bed 20.

To improve the permeation of the bulk gas mixture including the first chemical species into the particulate bed 20, the particulate bed 20 is mechanically fluidized to increase the number or size of the interstitial voids between the particles forming the bed. Additionally, the mechanical fluidization of the particulate bed 20 causes the particles within the bed to flow and circulate throughout the bed, thereby drawing the first chemical species into the bed and hastening the permeation and mixing of the first chemical species throughout the mechanically fluidized particulate bed 20. The intimate contact achieved between the first chemical species and the heated particles within the mechanically fluidized particulate bed 20 results in the thermal decomposition of at least a portion of the first chemical species to provide the second chemical species that is deposited in the exterior surface of the particles forming the mechanically fluidized particulate bed 20.

In operation, the fresh particles 92 initially forming and those added to the particulate bed 20 may be of a similar size (e.g., 0.25 mm). However, as the second chemical species is deposited on the exterior surface of the particles, a distribution of particle diameters (e.g., 0.25 mm to 2.5 mm) forms in the particulate bed 20. Additional fine particles, or "fines," may be formed within the particulate bed 20 by the abrasion and fracturing of the particles in the particulate bed 20 or by self nucleation of the second chemical species. At times, it may be advantageous to retain the fines within the mechanically fluidized particulate bed 20 to provide additional second chemical species deposition sites or to reduce dust formation within the housing 30. At times, it may be advantageous to remove the fines from the system 100. Such removal may be at least partially effected, for example, by filtering at least a portion of the bulk gas mixture present in the upper portion of the chamber 33. Such removal may also be at least partially effected, for example, by filtering at least a portion of the exhaust gas removed from the upper portion of the chamber 33. Such removal of the fines from the system 100 by filtration of the bulk gas mixture or the exhaust gas is possible because the gaseous convection currents generated by the mechanically fluidized particulate bed 20 will naturally tend to move these particles, formed by attrition, into the bulk gas mixture above the bed. It is also advantageous to remove the larger coated particles formed by the deposition of the second chemical species. Within the mechanically fluidized particulate bed 20, the coated particles 22 having a larger diameter (i.e., those having greater deposits of the second chemical species) will tend to "rise" within the bed 20 and "float" on the surface of the bed 20 while particles having a smaller diameter 24 (i.e., those having lesser deposits of the second chemical species) will tend to "sink" within the bed 20. In some instances, this effect can be enhanced by placing an electrostatic charge on all or a portion of the pan 12 to electrostatically attract the smaller particles towards the pan 12 and thus to the bottom of the bed 20 thereby retaining the smaller particles within the bed 20 and reducing the formation of dust within the upper portion of the chamber 33.

Within the system 100, the chamber 32 has been apportioned into an upper portion 33 and a lower portion 34 using a partitioning subsystem 40 that includes a flexible membrane 42 that is physically affixed, attached, or coupled 44 to the pan 12 and physically coupled 46 to the reaction vessel 30. The flexible membrane 42 apportions the chamber 32 such that the upper surface of the pan 12a is exposed to the upper portion of the chamber 33 and the lower surface of the pan 12b is exposed to the lower portion of the chamber 34.

To accommodate the relative motion between the pan 12 and the reaction vessel 30 that occurs during operation of the system 100, the flexible membrane 42 can include a material or be of a construction that is able to withstand the potentially extended and repeated oscillation or vibration of the pan 12 along the single axis of motion 54. In some instances, the flexible membrane 42 can be of a bellows type construction that accommodates the displacement of the pan 12 along the single axis of motion 54. In other instances, the flexible membrane 42 can include a "boot" or similar flexible coupling or membrane that incorporates or includes a resilient material that is both chemically and thermally resistant to the physical and chemical environment in both the upper 33 and lower 34 portions of the chamber 32. In at least some instances, the flexible membrane 42 may be in whole or in part a flexible metallic member, for example a flexible 316SS member. In at least some embodiments, the physical coupling 46 of the flexible membrane 42 to the reaction vessel 30 may include a flange or similar structure adapted for insertion between two or more reaction vessel 30 mating surfaces, for example between the flanges 36 as shown in FIG. 1. The physical coupling 44 between the flexible membrane 42 and the pan 12 can be made along one or more of: the upper surface of the pan 12a, the lower surface of the pan 12b, or the perimeter wall of the pan 12c. In some instances, all or a portion of the flexible membrane 42 may be integrally formed with at least a portion of the pan 12 or at least a portion of the reaction vessel 30. In some instances, where some or all of the flexible membrane 42 comprises a metallic member, the flexible membrane 42 may be welded or similarly thermally bonded to the pan 12, the vessel 30, or both the pan 12 and the vessel 30.

Gas including the first chemical species and, optionally, one or more diluent(s) are mixed and supplied as a bulk gas mixture by the gas supply subsystem 70 to the upper portion of the chamber 33 via the single inlet 84. The bulk gas mixture supplied to the upper portion of the chamber 33 produce a pressure that is measurable, for example using a pressure transmitter 176. If pressure were permitted to build within only the upper portion of the chamber 33 the amount of force required from the transmission subsystem 50 to oscillate or vibrate the pan 12 along the single axis of motion 54 would increase as the pressure of the bulk gas mixture in the upper portion of the chamber 33 is increased due to the pressure exerted by the bulk gas mixture on the upper surface of the pan 12a. To reduce the force required to oscillate or vibrate the pan 12, an inert gas or inert gas mixture may be introduced to the lower portion of the chamber 34 using an inert gas supply subsystem 150. Introducing an inert gas into the lower portion of the chamber 34 can reduce the pressure differential between the upper portion of the chamber 33 and the lower portion of the chamber 34. Reducing the pressure differential between the upper portion of the chamber 33 and the lower portion of the chamber 34 reduces the output force required from the transmission subsystem 50 to oscillate or vibrate the pan 12.

The transmission subsystem 50 is used to oscillate or vibrate the pan 12 along the single axis of motion 54. The transmission subsystem 50 includes any system, device, or any combination of systems and devices capable of providing an oscillatory or vibratory displacement of the pan 12 along the single axis of motion 54. In at least some instances, the single axis of motion 54 can be normal (i.e., perpendicular) to the upper surface of the pan 12a. The transmission subsystem 50 can include at least one electrical system, mechanical system, electromechanical system, or combinations thereof capable of oscillating or vibrating the pan 12 along the single axis of motion 54. One or more bushings 56a, 56b (collectively, "bushings 56") substantially align the vibratory or oscillatory motion of the pan 12 along the single axis of motion 54.

The bushings 56 also restrict, constrain, or otherwise limit the uncontrolled or unintended displacement of the pan 12 either laterally or in other directions that are not aligned with the single axis of motion 54. Maintaining the vibratory or oscillatory motion of the pan 12 in substantial alignment with the single axis of motion 54 advantageously reduces the likelihood of forming of "fines" within the mechanically fluidized particulate bed 20 and advantageously increases the uniformity of coated particle distribution in the pan 12, thereby improving the overall conversion, yield, or particle size distribution within the particulate bed 20. Limiting the formation of "fines" within the particulate bed 20 can increase the overall yield of the second chemical species by increasing the quantity of the second chemical species deposited on the particles forming the particulate bed 20.

The first bushing 56a is disposed about the oscillatory transmission member 52 and includes an aperture through which the oscillatory transmission member 52 passes. In some instances, the first bushing 56a may be disposed about the oscillatory transmission member 52 proximate the vessel wall 31. In other instances the first bushing 56a may be disposed about the oscillatory transmission member 52 remote from the vessel wall 31. In some instances the second bushing 56b is disposed along the single axis of motion 54 at a location remote from the first bushing 56a and also includes an aperture through which the oscillatory transmission member 52 passes. Such a spaced arrangement of the bushings 56 with passages aligned along the single axis of motion 54 assists in maintaining the alignment of the oscillatory transmission member 52 along the single axis of motion 54. Further, the spaced arrangement of the bushings 56 also advantageously limits or constrains the motion or displacement of the oscillatory transmission member 52 in directions that are not aligned with the single axis of motion 54.

The oscillatory transmission member 52 can be driven using any number of electrical, mechanical, or electromechanical drivers. In at least some situations, the driver can include an electromechanical system comprising a prime mover such as a motor 58, coupled to a cam 60 or similar device that is capable of providing a regular, repeatable, oscillatory or vibratory motion via a linkage 62 to the oscillatory transmission member 52 that is, in turn, transmitted to the pan 12. The oscillation or vibration of the pan 12 along the single axis of motion 54 may occur at one or at any number of frequencies. For example, the pan 12 may be oscillated or vibrated at a first frequency for a first period of time, and at a second frequency that is different from the first frequency, and may be 0 Hz, for a second period of time. In at least some instances, the pan 12 can have a frequency of oscillation or vibration of from about 1 cycle per second (Hz) to about 4,000 Hz; about 500 Hz to about 3,500 Hz; or about 1,000 Hz to about 3,000 Hz.

Further, the magnitude of the oscillatory or vibratory displacement of the pan 12 along the single axis of motion 54 may be fixed or varied based at least in part upon the desired properties of the second chemical species coating the particles in the mechanically fluidized particulate bed 20. In at least some instances, the pan 12 can have an oscillatory or vibratory displacement of from about 0.01 inches to about 0.5 inches; or from about 0.015 inches to about 0.25 inches; or from about 0.03 inches to about 0.125 inches. In at least some instances, either or both the frequency of the oscillation or vibration of the pan 12 or the oscillatory or vibratory displacement of the pan 12 may be continuously adjustable over one or more ranges or values, for example using the control system 190. Altering or adjusting the frequency or displacement of the oscillation or vibration of the pan 12 can provide conditions conducive to the deposition of a second chemical species having a preferred depth, structure, composition, or other physical or chemical properties, on the surface of the particles in the mechanically fluidized particulate bed 20.

In some instances, a boot 64 is disposed about the oscillatory transmission member 52. The boot 64 can be fluidly coupled to the vessel 30, for example at the vessel wall 31, the oscillatory transmission member 52, or both the vessel 30 and the oscillatory transmission member 52. The boot 64 isolates the lower portion of the chamber 34 from the external environment 39 about the vessel 30. In some instances, the boot 64 can be replaced or augmented using a shaft seal to prevent the emission of gas from the lower portion of the chamber 34 to the external environment 39. The boot 64 provides a secondary sealing member (in addition to the flexible membrane 42)

that prevents the escape of the gas containing the first chemical species to the external environment 39. In some instances, the first chemical species can include silane which may be pyrophoric under conditions typically found in the external environment 39. In such an instance, the second seal provided by the boot 64 can minimize the likelihood of a leak to the external environment even in the event of a flexible membrane 42 failure.

In some instances, the boot 64 can include a bellows-type seal or a similar flexibly pleated membrane-like structure. In other instances, the boot 64 can include an elastomeric flexible-type coupling or similar elastomeric membrane-like structure. A first end of the boot 64 may be temporarily or permanently affixed, attached, or otherwise bonded to the exterior surface of the vessel wall 31 and the second end of the boot 64 may be similarly temporarily or permanently affixed, attached, or otherwise bonded to a ring 66 or similar structure on the oscillatory transmission member 52. In at least some instances, a gas detector (not shown in FIG. 1) that is responsive to the first chemical species, the one or more diluent(s), or the inert gas within the chamber 32 may be disposed at a location either internal to the lower portion of the chamber 34 or external to the boot 64 to detect leakage from the reaction vessel 30.

The pan 12 oscillates or vibrates to mechanically fluidize the particulate bed 20. The motion of the oscillatory transmission member 52 through the bushing 56a can create contaminants during normal operation. Such contaminants may include, inter alia, shavings from or pieces of the bushing 56a, metallic shavings from the oscillatory transmission member 52, and the like which may be expelled into the chamber 32. In the absence of the flexible member 44, such contaminants expelled into the chamber 32 may enter the mechanically fluidized particulate bed 20, potentially contaminating all or a portion of the coated particles 22 contained therein. The presence of the flexible member 44 therefore reduces the likelihood of contamination within the mechanically fluidized particulate bed 20 from metal or plastic shavings, lubricants, or similar debris or materials generated as a consequence of the routine operation of the transmission subsystem 50.

The inert gas supply subsystem 150 that is fluidly coupled to the lower portion of the chamber 34 can include an inert gas reservoir 152, conduits 154, and one or more inert gas final control elements 156, such as one or more flow or pressure control valves. The one or more inert gas final control elements 156 can modulate, regulate, or otherwise control the admission rate or pressure of the inert gas in the lower portion of the chamber 34. The inert gas provided from the inert gas reservoir 152 can include one or more gases displaying non-reactive properties in the presence of the first chemical species. In some instances, the inert gas can include, but is not limited to, at least one of: argon, nitrogen, or helium.

The inert gas in the lower portion of the chamber 34 can be maintained at a pressure greater than the pressure of the bulk gas mixture in the upper portion of the chamber 33. By maintaining the pressure in the lower portion of the chamber 34 at a level greater than the pressure in the upper portion of the chamber 33, any breach of or leakage through the flexible membrane 42 will result in passage of the inert gas from the lower portion of the chamber 34 to the upper portion of the chamber 33. In some instances, an analyzer or detector responsive to at least the inert gas in the lower portion of the chamber 34 may be placed in the upper portion of the chamber 33. Detection of such inert gas leakage to the upper portion of the chamber 33 can indicate a failure of the flexible membrane 42 while retaining the first chemical species safely within the upper chamber 33. In some instances, an analyzer or detector responsive to the inert gas in the lower portion of the chamber 34 may be placed in the exterior environment 39 about the vessel 10 to detect an external leak of non-reactive gas from the lower portion of the chamber 34. The inert gas introduced to the lower portion of the chamber 34 can be at a pressure of from about 5 psig to about 300 psig; from about 5 psig to about 250 psig; from about 5 psig to about 200 psig; from about 5 psig to about 150 psig; from about 5 psig to about 100 psig; or from about 5 psig to about 50 psig.

The temperature of the inert gas in the lower portion of the chamber 34 as measured using one or more temperature transmitters 175 may be maintained below the thermal decomposition temperature of the first chemical species. Maintaining the temperature of the inert gas below the thermal decomposition temperature of the first chemical species advantageously reduces the likelihood of second chemical species deposition on the flexible member 44 since the relatively cool inert gas will tend to limit the buildup of heat within the flexible member 44 during routine operation of the system 100. The inert gas introduced to the lower portion of the chamber 34 can be at a temperature of from about 25° C. to about 375° C.; from about 25° C. to about 300° C.; from about 25° C. to about 225° C.; from about 25° C. to about 150° C.; or from about 25° C. to about 75° C.

One or more differential pressure systems 170 are used to monitor and, if necessary, control the pressure differential between the upper portion of the chamber 33 and the lower portion of the chamber 34. As discussed above, an excessive differential pressure between the upper portion 33 and the lower portion 34 of the chamber 32 can increase the force and consequently the power required to oscillate or vibrate the pan 12. The differential pressure system 170, including a lower chamber pressure sensor 171 and an upper chamber pressure sensor 172 coupled to a differential pressure transmitter 173 can be used to provide a process variable signal indicative of the pressure differential between the upper 33 and lower 34 portions of the chamber 32. The differential pressure between the upper portion 33 and the lower portion 34 of the chamber 32 can be controlled or adjusted by the control system 190. For example, the control system 190 may adjust the pressure in the upper portion of the chamber 33 by adjusting the flow or pressure of the bulk gas mixture introduced to the upper portion of the chamber 33 by modulating or controlling final control elements 76 or 82, respectively, or by modulating or controlling exhaust valve 118.

The control system 190 may adjust the pressure in the lower portion of the chamber 34 by adjusting the flow or pressure of the inert gas introduced to the lower portion of the chamber 34 from the inert gas reservoir 152 by modulating or controlling final control element 156. The differential pressure between the upper portion of the chamber 33 and the lower portion of the chamber 34 can be maintained at less than about 25 psig; less than about 10 psig; less than about 5 psig; less than about 1 psig; less than about 20 inches of water; or less than about 10 inches of water.

The heater 14 proximate the pan 12 may take a variety of forms, for example one or more radiant or resistive elements that produce thermal energy in the form of heat in response to the passage of an electrical current provided by a source 192. The heater 14 increases the temperature of the pan 12 and the mechanically fluidized particulate bed 20 contained therein via the conductive and radiant transfer of thermal energy provided by the heater 14 through the pan 12. The heater 14 may for instance, be similar to the nickel/chrome/iron ("nichrome" or Calrod®) electric coils commonly found in electric cook top stoves, or immersion heaters. The temperature of the particulate bed 20 can be measured using one or more temperature transmitters 178. In some instances, the control system 190 may variably adjust the current output of the source 192 responsive to the measured temperature of the mechanically fluidized particulate bed 20, to maintain a particular bed temperature. The control system 190 can maintain the mechanically fluidized particulate bed 20 at or above a particular temperature that is greater than the thermal decomposition temperature of the first chemical species at the measured process conditions (e.g., pressure, bulk gas composition, etc.) in the upper portion of the chamber 33.

For example, where the first chemical species comprises silane and the measured gauge pressure within the reaction vessel is about 175 pounds per square inch (psig), a temperature of about 550° C. will result in the thermal decomposition of the silane and the deposition of polysilicon (i.e., the second chemical species) on the particles in the particulate bed 20. Where chlorosilanes form at least a portion of the first chemical species in the mechanically fluidized particulate bed 20, a temperature commensurate with the decomposition temperature of the particular chlorosilane or chlorosilane mixture is used. Dependent on the measured pressure within the upper portion of the chamber 33 and the composition of the first chemical species, the mechanically fluidized particulate bed 20 can have an average or bulk temperature of from about 100° C. to about 900° C.; of from about 200° C. to about 700° C.; or of from about 300° C. to about 600° C. In at least some instances, the temperature of the mechanically fluidized particulate bed 20 may be manually, semi-automatically, or automatically adjustable over one or more ranges or values, for example using the control system 190 to provide a thermal environment within the particulate bed 20 that is conducive to the deposition of the second chemical species having a preferred thickness, structure, or composition on the surface of the particles in the mechanically fluidized particulate bed 20.

The heater 14 may be enclosed in a sealed container. A thermally insulating material 16 may be deposited about all sides of the radiant or resistive element(s) except for the portion that forms the bottom surface of the pan 12b or the portion of the radiant or resistive element(s) that are proximate the bottom surface of the pan 12b. The thermally insulating material 16 may, for instance be a glass-ceramic material (e.g., $Li_2O \times Al_2O_3 \times nSiO_2$-System or LAS System) similar that used in "glass top" stoves where the electrical heating elements are positioned beneath a glass-ceramic cooking surface. In some situations, the thermally insulating material 16 may include one or more rigid or semi-rigid refractory type materials such as calcium silicate. In some instances, a thermally reflective material may be included in the thermally insulating material 16 to reflect at least a portion of the thermal energy emitted by the heater 14 towards the lower surface of the pan 12b.

In at least some instances, at least one thermally reflective member 18 may be located within the upper portion of the chamber 33 and positioned to return at least a portion of the thermal energy radiated by the mechanically fluidized particulate bed 20 back to the bed. Such thermally reflective members 18 may advantageously assist in reducing the quantity of energy consumed by the heater 14 in maintaining the temperature of the mechanically fluidized particulate bed 20. Additionally, the at least one thermally reflective member 18 may also advantageously assist in maintaining a temperature in the upper portion of the chamber 33 that is below the thermal decomposition temperature of the first chemical species by limiting the quantity of thermal energy radiated from the mechanically fluidized particulate bed 20 to the upper portion of the chamber 33. In at least some instances, the thermally reflective member 18 may be a polished thermally reflective stainless steel or nickel alloy member. In other instances, the thermally reflective member 18 may be a member having a polished thermally reflective coating comprising one or more precious metals such as silver or gold.

In semi-batch operation, a gas containing the first chemical species (e.g., silane or one or more chlorosilanes) is transferred from the first chemical species reservoir 72 and mixed with one or more diluent(s) (e.g., hydrogen) transferred from the diluent reservoir 78 to form a bulk gas mixture. The bulk gas mixture is introduced to the upper portion of the chamber 33. Within the upper portion of the chamber 33 surfaces at a temperature exceeding the thermal decomposition temperature of the first chemical species promote the thermal decomposition of the first chemical species and the deposition of the second chemical species (e.g., polysilicon) on those surfaces. Thus, by maintaining the particles in the mechanically fluidized particulate bed 20 at a temperature greater than the thermal decomposition temperature of the first chemical species, the first chemical species thermally decomposes within the mechanically fluidized particulate bed 20 and deposits the second chemical species on the exterior surfaces of the particles contained therein.

If the temperature of the upper portion of the chamber 33 and the various components within the upper portion of the chamber 33 are maintained below the thermal decomposition temperature of the first chemical species, then the likelihood of deposition of the second chemical species on those surfaces is reduced. Advantageously, if the temperature of the mechanically fluidized particulate bed 20 is the only location within the upper portion of the chamber 33 that is maintained above the decomposition temperature of the first chemical species, then the likelihood of deposition of the second chemical species within the mechanically fluidized particulate bed 20 is increased while the likelihood of deposition of the second chemical species outside of the particulate bed 20 is reduced.

In at least some instances, the control system 190 can vary or adjust the operation of the mechanically fluidized particulate bed 20 to advantageously alter or affect the yield, composition, or structure of the second chemical species deposited on the particles forming the particulate bed 20. For example, in some instances the controller may oscillate or vibrate the mechanically fluidized particulate bed 20 at a first frequency for a first period of time, followed by stopping or halting the oscillation or vibration the bed for a second period of time. Alternating a period of bed circulation with a period absent bed circulation can advantageously promote the permeation of the first chemical species into the interstitial spaces within the mechanically fluidized particulate bed 20 while the bed is fluidized. When the oscillation or vibration of the particulate bed 20 is halted, all or a portion of the first chemical species can be trapped within the settled bed. The ratio of the first time (i.e., the time the bed is fluidized) to the second time (i.e., the time the bed is settled) can be less than about 10,000:1; less than about 5,000:1; less than about 2,500:1; less than about 1,000:1; less than about 500:1; less than about 250:1; less than about 100:1; less than about 50:1; less than about 25:1; less than about 10:1; or less than about 1:1.

The second chemical species is deposited on the exterior surfaces of the particles forming the mechanically fluidized particulate bed 20. Particles with second chemical species deposits form coated particles 22 that may be removed from the bed 20 on a batch, semi-continuous, or continuous basis while operating the system 100 in a semi-batch mode. A particulate supply subsystem 90 may supply fresh particles 92 to the particulate bed 20 on an "as needed" basis, for example to maintain a desired particulate bed 20 depth as coated particles 22 are removed from the bed. The particulate supply subsystem 90 may include a particulate transporter 94, for example a conveyor, to deliver the fresh particles 92 from the particulate reservoir 96 directly to the particulate bed 20 or one or more intermediate systems such as a particle inlet subsystem 98. In some embodiments, a particle feed vessel 102 in the particle inlet subsystem 98 may serve as a reservoir of fresh particles 92 for supply to the particulate bed 20. The fresh particles 92 may have any of a variety of forms. For example, the fresh particles 92 may be provided as regularly or irregularly shaped particles which serve as a nucleus for the deposition of the second chemical species in the mechanically fluidized particulate bed 20. The fresh particles 92 supplied to the particulate bed 20 can have a diameter of from about 0.1 mm to about 2 mm; from about 0.15 mm to about 1.5 mm; from about 0.25 mm to about 1.5 mm; from about 0.25 mm to about 1 mm; or from about 0.25 mm to about 0.5 mm. At times the mechanical oscillation or vibration of the pan 12 has been found to create additional dust for example through physical abrasion or erosion of the particles and thus the particulate bed 20 may become at least partially self-seeding, thereby proportionately reducing the quantity of fresh particles 92 added by the particle inlet subsystem 98.

The sum of the surface areas of each of the particles in the particulate bed 20 provides an aggregate bed surface area. In at least some instances, the quantity of particles added to the particulate bed 20 by the particle inlet subsystem 98 may controlled, for example using the control system 190, to maintain a target ratio of aggregate bed surface area to upper surface 12a surface area. The aggregate bed surface area to upper surface 12a surface area can provide a ratio of from about 10:1 to about 10,000:1; about 10:1 to about 5,000:1; about 10:1 to about 2,500:1; about 10:1 to about 1,000:1; about 10:1 to about 500:1; or about 10:1 to about 100:1.

In other instances, the number of fresh particles 92 added to the particulate bed 20 by the particulate supply subsystem 98 may be based on the overall area of the upper surface of the pan 12a. It has been unexpectedly found that the size of the coated particles 22 produced in the mechanically fluidized particulate bed 20 operating at a given production rate, is a strong function of the number of fresh (i.e., seed) particles 92 added per unit time per unit area of the pan 12. In fact, the number of fresh particles 92 added per unit time per unit area of the pan is at least one identified controlling factor establishing the size of coated particles 22. The particulate supply subsystem 98 can add particles to the particulate bed 20 at a rate of from about 1 particle/minute-square inch of upper surface 12a area (p/m-in$^2$) to about 1,000 p/m-in$^2$; about 2 p/m-in$^2$ to about 200 p/m-in$^2$; about 5 p/m-in$^2$ to about 150 p/m-in$^2$; about 10 p/m-in$^2$ to about 100 p/m-in$^2$; or about 10 p/m-in$^2$ to about 80 p/m-in$^2$.

The particulate transporter 94 can include at least one of: a pneumatic feeder (e.g., a blower); a gravimetric feeder (e.g., a weigh-belt feeder); a volumetric feeder (e.g., a screw type feeder); or combinations thereof. In at least some instances, the volumetric or gravimetric delivery rate of the particulate transporter 94, may be continuously adjusted or varied over one or more ranges, for example the control system 190 may continuously control the weight or volume of fresh particles 92 delivered by the particle conveyance subsystem 90 and by correlation with the weight of the average coated particle 22, the number of particles added per unit time.

The particle inlet subsystem 98 receives fresh particles 92 from the particulate transporter 94 and includes: a particle inlet valve 104, a particle feed vessel 102, and a particle outlet valve 106. Particles are discharged from the particulate transporter 94 through the particle inlet valve 104 and into the particle feed vessel 102 where the fresh particles 92 accumulate. The accumulated fresh particles 92 in the particle feed vessel 102 may be discharged in a batch or semi-batch manner via the particle outlet valve 106 to the particle bed 20. The particle inlet valve 104 and the particle outlet valve 106 can include any type of flow control device, for example one or more motor driven, variable speed, rotary valves. In at least some instances, the fresh particles 92 flowing into the upper portion of the chamber 33 are deposited in particulate bed 20 using a hollow member 108 such as a dip-tube, pipe, or the like. The control system 190 may coordinate or synchronize volume or weight of fresh particles 92 supplied by the particulate supply subsystem 90 to the volume or weight of the coated particles 22 removed by the coated particle collection subsystem 130. Using the control system 190 to coordinate or synchronize the volumetric feed rate of fresh particles 92 to the particulate bed 20 with the volumetric removal rate of coated particles 22 from the particulate bed 20 produces a semi-batch system capable of maintaining a relatively constant depth mechanically fluidized particulate bed 20 while providing a periodic or batch discharge of coated particles 22 from the particulate bed 20.

The gas supply subsystem 70 includes a first chemical species reservoir 72 containing a gas including at least the first chemical species that is fluidly coupled to a diluent reservoir 78 containing the one or more diluent(s). Flow from each of the reservoirs 72, 78 is mixed and enters the upper portion of the chamber as a bulk gas mixture via the single inlet 84. The gas supply subsystem 70 also includes various conduits 74, 80, a first chemical species final control element 76, a diluent final control element 82, and other components that, for clarity, are not shown in FIG. 1 (e.g., blowers, compressors, eductors, block valves, bleed systems, environmental control systems, etc.) but are operable to provide the bulk gas mixture containing the first chemical species to the upper portion of the chamber 33 via the single inlet 84 in a controlled, safe, and environmentally conscious manner.

The gas containing the first chemical species may include one or more diluents (e.g., hydrogen) mixed with the first chemical species. The first chemical species can include at least one of: silane, monochlorosilane, dichlorosilane, trichlorosilane, or tetrachlorosilane. The one or more diluent(s) stored in the diluent reservoir 78 can be the same as or different from the diluent in the gas stored in the first chemical species reservoir 72. Although hydrogen is used as an illustrative example, diluents other than hydrogen may be used in the upper portion of the chamber 33.

Although shown in FIG. 1 as entering at the top of the upper portion of the chamber 33, the bulk gas mixture may be introduced, in whole or in part, at any point within the upper portion of the chamber 33. In some instances, at least a portion of the bulk gas mixture may be introduced to the sides of the upper portion of the chamber 33. In other instances, at least a portion of the bulk gas mixture may be added to the upper portion of the chamber 33 by sparging the bulk gas mixture through all or a portion of the mechanically fluidized particulate bed 20, for example using one or more flexible connections to a gas distributor located on the upper surface of the pan 12a. The feed gases comprising the first chemical species may be added intermittently or continuously to the upper portion of the chamber 33. In at least some instances the bulk gas mixture, derived from the feed gases and subsequent reaction involving the feed gases in system 32 may be introduced into or received directly by the mechanically fluidized particulate bed 20 via one or more apertures present in the thermally conductive member 18.

Within the upper portion of the chamber 33, the flow or pressure of the bulk gas mixture may be continuously adjusted or varied by the control system 190 to maintain any pressure within the upper portion of the chamber 33 as measured using the pressure transmitter 176. In one example semi-batch operation, the upper portion of the chamber 33 is charged with silane gas and the particulate bed 20 is heated and mechanically fluidized. As silane thermally decomposes within the mechanically fluidized particulate bed 20, silicon is deposited on the surface of the particles in the particulate bed 20, forming coated particles 22 therein. As the coated particles 22 increase in diameter (and volume) the particulate bed depth increases and coated particles 22 fall into the hollow member 132 on a more or less continuous basis. In such an example, the partial pressure of silane in the upper portion of the chamber 33 will be greatest at the start of the semi-batch operation. In some instances, at the start of the semi-batch operation the silane can have a partial pressure of from about 0.5 atm. to about 16 atm. In some instances, at the start of the semi-batch operation the diluent (e.g., hydrogen) can have a partial pressure of from about 0 atm. to about 32 atm. In some instances, at the start of the semi-batch operation the diluent can have a mole fraction of from about 0 mol % to about 99 mol %. In an example semi-batch operation where the initial partial pressures are 2 atmospheres each of silane and hydrogen, the final partial pressures will be about 0 atmospheres of silane and 6 atmospheres of hydrogen. In another example semi-batch operation, where the initial partial pressure of silane is 4 atmospheres of silane and 0 atmospheres of hydrogen, the final partial pressures will be about 0 atmospheres of silane and 8 atmospheres of hydrogen.

In some instances, the upper portion of the chamber 33 can be maintained at a pressure of from about 5 psia (0.33 atm.) to about 600 psia (40 atm.); from about 15 psia (1 atm.) to about 220 psia (15 atm.); from about 30 psia (2 atm.) to about 185 psia (12.5 atm.); or from about 75 psia (5 atm.) to about 175 psia (12 atm.). Within the upper portion of the chamber 33, the first chemical species can be at a partial pressure of from about 15 psi (1 atm.) to about 220 psi (15 atm.); from about 15 psi (1 atm.) to about 150 psi (10 atm.); from about 15 psi (1 atm.) to about 75 psi (5 atm.); or from about 15 psi (1 atm.) to about 45 psi (3 atm.). Within the upper portion of the chamber 33, the one or more diluent(s) can be at a partial pressure of from about 15 psi (1 atm.) to about 500 psi (35 atm.); from about 15 psi (1 atm.) to about 220 psi (15 atm.); from about 15 psi (1 atm.) to about 150 psi (10 atm.); from about 0.1 psi (0.01 atm.) to about 220 psi (15 atm.); or from about 45 psi (3 atm.) to about 150 psi (10 atm.). In one illustrative example of continuous operation, the operating pressure within the upper portion of the chamber 33 is maintained at about 165 psia (11 atm.), with the partial pressure of silane (i.e., the first chemical species) maintained at about 30 psi (2 atm.), and the partial pressure of hydrogen (i.e., the diluent) maintained at about 135 psi (9 atm.). The diluent may be added as a feed gas to the upper portion of the chamber 33 or in the case of silane decomposition may be produced as a byproduct of the decomposition according to the formula $SiH_4 \rightarrow Si+2H_2$.

Within the upper portion of the chamber 33, the composition of the bulk gas mixture may be continuously adjusted, controlled, or otherwise varied by the control system 190 to maintain any desired bulk gas mixture composition within the upper portion of the chamber 33. In some instances, the bulk gas mixture composition in the upper portion of the chamber 33 may be periodically or intermittently sampled and analyzed using one or more gas analyzers responsive to the first chemical species, the diluent or both the first chemical species and the diluent. In some instances the analyzer may include an online gas chromatograph responsive to the concentration of the first chemical species in the upper portion of the chamber 33. The use of such analyzers may advantageously provide an indication of the conversion and rate at which the first reactant is being converted to second product.

The flow or pressure of either or both the gas and the diluent may be further continuously adjusted or varied using the control system 190 to maintain any desired bulk gas composition within the upper portion of the chamber 33. In some situations, the concentration of the first chemical species in the bulk gas mixture in the upper portion of the chamber 33 can range from about 0.1 mol % to about 100 mol %; about 0.5 mol % to about 50 mol %; from about 5 mol % to about 40 mol %; from about 10 mol % to about 40 mol %; from about 10 mol % to about 30 mol %; or from about 20 mol % to about 30 mol %. In some situations, the concentration of the diluent(s) in the bulk gas mixture in the upper portion of the chamber 33 can range from about 0 mol % to about 95 mol %; from about 50 mol % to about 95 mol %; from about 60 mol % to about 95 mol %; from about 60 mol % to about 90 mol %; from about 70 mol % to about 90 mol %; or from about 70 mol % to about 80 mol %.

A gas circulator 48 can be at least partially disposed within the upper portion of the chamber 33 to promote the flow of the bulk gas mixture throughout the upper portion of the chamber 33. The gas circulator 48 can include one or more systems or devices to circulate the bulk gas mixture, including the first chemical species and any diluent(s) throughout all or a portion of the upper portion of the chamber 33. In some instances the gas circulator 48 is a variable or fixed speed fan as shown in FIG. 1 however, other gas circulating devices such as eductors may be substituted or added.

The volumetric transfer rate is that rate, expressed for example in liters per minute per square inch of pan surface area, at which the bulk gas mixture containing the first chemical species contained in the upper portion of the chamber 33 permeates the mechanically fluidized particulate bed 20. The volumetric transfer rate may be controlled by factors comprising the total pressure within the upper portion of the chamber 33, the speed of the gas circulator 48, the size of the aperture in the thermally reflective member 18, and the surface area of the upper surface of the pan 12a. Using the gas circulator 48, higher volumetric transfer rates are achievable based upon the increased gas turnover provided by the gas circulator 48. The mechanically fluidized particulate bed 20 can have a volumetric transfer rate of from about 0.01 liters per minute per square inch of upper surface 122a area (1/min-in$^2$) to about 2.00 l/min-in$^2$; from about 0.02 l/min-in$^2$ to about 1.50 l/min-in$^2$; from about 0.03 l/min-in$^2$ to about 1.00 l/min-in$^2$; or from about 0.04 l/min-in$^2$ to about 0.25 l/min-in$^2$. The gas circulator 48 can assist the permeation of the first chemical species into the interstitial spaces existent within the mechanically fluidized particulate bed 20. Increasing the permeation of the first chemical species within the mechanically fluidized particulate bed 20 may improve the volumetric transfer rate as much as five times over comparable rates achieved in the absence of the gas circulator 48.

When the mechanically fluidized particulate bed 20 is designed according to the teachings contained herein most, if not essentially all, of the first chemical species (e.g., silane present in the bulk gas mixture transferred into the bed 20) will thermally decompose in the mechanically fluidized particulate bed 20 to provide coated particles 22 containing the second chemical species (e.g., polysilicon). The required pan 12 size can be calculated using the surface are of the particles comprising the bed, the volumetric transfer rate, and the partial pressure of first chemical species in the bulk gas mixture in the upper portion of the chamber 33. The volumetric transfer rate is a function of factors including fan speed 48 and efficiency, and the vibration or oscillation frequency and amplitude of the mechanically fluidized particulate bed 20.

Additionally, should the bulk gas mixture be introduced at a temperature below the decomposition temperature of the first chemical species, the gas circulator 48 can promote the flow of the relatively cool gas across the thermally reflective member 18, thereby advantageously lowering the temperature of the thermally reflective member 18 and reducing the likelihood of undesired deposition of the second chemical species on the thermally reflective member 18. In a similar manner, circulating the bulk gas mixture within the upper portion of the chamber 33 may also maintain the surface temperature of structures within the upper portion of the chamber 33 below the decomposition temperature of the first chemical species, thereby reducing the likelihood of deposition of the second chemical species on those surfaces.

In at least some instances, the control system 190 can be communicably coupled to the gas circulator 48 to provide for the operation of the gas circulator 48 across a range of bulk gas circulation rates. For example, operating in batch mode, the control system 190 may cause the gas circulator 48 to increase the bulk gas circulation rate with increasing batch time. In other instances the control system 190 can selectively operate the gas circulator 48 based upon one or more extrinsic operating parameters. For example, the control system 190 may inhibit the operation of the gas circulator 48 when the particle inlet subsystem 90 adds fresh particles 92 to the mechanically fluidized particulate bed 20 to prevent entrainment of the added particulate in the bulk gas mixture circulated within the upper portion of the chamber 33.

In at least some instances, the bulk gas mixture containing the first chemical species in the upper portion of the chamber 33 is maintained at a temperature below the decomposition temperature of the first chemical species. The temperature of the bulk gas mixture is maintained at a temperature that is sufficiently low to minimize the likelihood of auto-decomposition of the first chemical species outside of the mechanically fluidized particulate bed 20, yet that is sufficiently high to minimize the energy demand placed on the heater 14 to maintain the mechanically fluidized particulate bed 20 at a temperature greater than the thermal decomposition temperature of the first chemical species. Similarly the feed gases added to the upper portion of chamber 33 are controlled at a temperature that is sufficiently low to minimize the likelihood of auto-decomposition of the first chemical species outside of the mechanically fluidized particulate bed 20, yet that is sufficiently high to minimize the energy demand placed on the heater 14 to maintain the mechanically fluidized particulate bed 20 at a temperature greater than the thermal decomposition temperature of the first chemical species. In some instances, the feed gas mixture may be added to the upper portion of the chamber 33 at a temperature that is about 10° C. to about 500° C. less than the thermal decomposition temperature of the first chemical species; about 10° C. to about 400° C. less than the thermal decomposition temperature of the first chemical species; about 10° C. to about 300° C. less than the thermal decomposition temperature of the first chemical species; about 10° C. to about 200° C. less than the thermal decomposition temperature of the first chemical species; or about 10° C. to about 100° C. less than the thermal decomposition temperature of the first chemical species. In other instances, the bulk gas mixture in the upper portion of the chamber 33 is controlled at a temperature of from about 30° C. to about 550° C.; about 30° C. to about 375° C.; about 30° C. to about 325° C.; about 30° C. to about 275° C.; about 30° C. to about 200° C.; or about 30° C. to about 125° C.

In at least some instances, the batch or semi-batch addition of the first chemical species to the chamber 106 may advantageously permit the use of a pure or near pure first chemical species (e.g., silane) to achieve an overall conversion to polysilicon of greater than about 70%; greater than about 75%; greater than about 80%; greater than about 85%; greater than about 90%; greater than about 95%; greater than about 99%; or greater than about 99.7%.

The gas recovery subsystem 110 includes an exhaust port 112 fluidly coupled to the upper portion of the chamber 33. The gas recovery subsystem 110 may include various exhaust conduits 114, exhaust fines separators 116, exhaust control devices 118, and other components (e.g., blowers, compressors) useful in removing or expelling as an exhaust 120 at least a portion of the bulk gas mixture from the upper portion of the chamber 33. The gas recovery system 110 may be useful in removing any unreacted first chemical species and any diluent(s) or byproducts present in the upper portion of the chamber 33 for additional processing, for example use in one or more subsequent reaction vessels 30. In some instances, the exhaust gas removed by the gas recovery subsystem 110 may be treated, separated, or otherwise purified prior to discharge, disposal, sale, or recovery.

Fines 122 such as amorphous silica (a.k.a. "poly-powder"), other decomposition byproducts, and physical erosion byproducts may be suspended in the exhaust gas removed from the upper portion of the chamber 33 by the gas recovery subsystem 110. In some instances the gas circulator 48 can be used, at least in part, to suspend such fines within the bulk gas mixture in the upper portion of the chamber 33 to assist in the removal of at least a portion of the suspended fines via the gas removed by the gas recovery subsystem 110. Fines 122 present in the exhaust gas removed from the upper portion of the chamber 33 can be separated in the exhaust fines separator 116. The exhaust fines separator 116 can include at least one separation stage, and may include multiple separation stages each using the same or a different solid/gas separation technology. In one example, the exhaust fines separator 116 includes a cyclonic separator followed by one or more particulate filters.

The coated particle collection subsystem 130 collects the coated particles 22 from the mechanically fluidized particulate bed 20. The coated particles 22 will generally "float" to the top surface of the mechanically fluidized particulate bed 20. Those particles on the surface of the mechanically fluidized particulate bed 20 overflow into the hollow member 132. The hollow member 132 projects a distance above the upper surface of the pan 12a and, in so doing, acts to limit the depth of the mechanically fluidized particulate bed 20. The particulate bed 20 can have a settled (i.e., in a non-mechanically fluidized state) bed depth of from about 0.10 inches to about 8 inches; from about 0.25 inches to about 6 inches; from about 0.50 inches to about 4 inches; from about 0.50 inches to about 3 inches; or from about 0.75 inches to about 2 inches. The number of fresh particles 92 added by the particulate feed subsystem 90 is sufficiently small that the impact on the volume of the mechanically fluidized particulate bed 20 is minimal. Substantially all of the volumetric increase experienced by the mechanically fluidized particulate bed 20 is therefore attributable to the deposition of the second chemical species (e.g. silicon/polysilicon) on the particles and the resultant increase in diameter (and volume) of the coated particles 22. The number of fresh particles 92 added to the particulate bed 20 can determines the size and number of the coated particles 22 produced in the particulate bed 20. It has also been observed that the size of the fresh particles 92 added to the particulate bed 20 has minimal impact on the size of the final coated particles 22 produced, instead the number of fresh particles added 92 to the particulate bed 20 has a much greater impact on the size of the coated particles 22. In some instances, the projection of the hollow member 132 above the upper surface of the pan 12a may be continuously adjusted to provide an adjustable particulate bed depth that controls or otherwise limits the range of coated particle 21 diameters produced within the mechanically fluidized particulate bed 20. The projection of the hollow member 132 above the upper surface of the pan 12a can be less than the height of the perimeter walls 12c so as to reduce the likelihood of spillage of the coated particles 22 over the perimeter walls of the pan 12c (minimal such spillage occurs when the flexible membrane 42 is used). In some instances, the control system 190 can continuously adjust or alter the projection of the hollow member 132 above the upper surface of the pan 12a based at least in part on a target diameter for the coated particles 22. Such adjustment of the projection of the hollow member 132 above the upper surface of the pan may be accomplished using an electromechanical system such as a motor driveably coupled to the hollow member 132 via a linkage or transmission assembly, or using an electromagnetic system such as magnetically coupling the hollow member to an electric coil. In some instances, the coated particles 22 removed from the mechanically fluidized particulate bed 20 can have a diameter of from about 0.5 mm to about 5 mm; from about 0.5 mm to about 4 mm; from about 0.5 mm to about 3 mm; from about 0.5 mm to about 2.5 mm; from about 0.5 mm to about 2 mm; from about 1 mm to about 2.5 mm; or from about 1 mm to about 2 mm.

Coated particles 22 removed via the hollow conduit 132 pass through one or more coated particle inlet valves 134 and accumulate in the coated particle discharge vessel 136. Coated particles 22 accumulated in the coated particle discharge vessel 136 are periodically or continuously removed as a finished coated particle 22 via one or more coated particle outlet valves 138. The coated particle inlet valve 134 and the coated particle outlet valve 138 can include any type of flow control device, for example one or more prime motor driven, variable speed, rotary valves. In at least some instances, the control system 190 can limit, control, or otherwise vary the discharge of finished coated particles 22 from the coated particle collection subsystem 130. In at least some instances, the control system 190 can adjust the removal rate of the coated particles 22 from the particulate bed 20 to match the addition rate of fresh particles 92 to the particulate bed 20. In some instances, the coated particles 22 may pass through one or more post-treatment processes on a continuous or on an "as-needed" basis, for example a heating process to de-gas hydrogen from the coated particles. Although not shown in FIG. 1, all or a portion of such post-treatment processes may be integrated into the particle collection subsystem 130.

The control system 190 may be communicatively coupled to control one or more other elements of the system 100. The control system 190 may include one or more temperature, pressure, flow, or analytical sensors and transmitters to provide process variable signals indicative of an operating parameter of one or more components of the system 100. For instance, the control system 190 may include a temperature transmitter (e.g., thermocouple, resistive thermal device, etc.) to provide one or more process variable signals indicative of a temperature of the bottom surface 12b of the pan 12 or of the mechanically fluidized particulate bed 20. The control system 190 may also receive process variable signals from sensors associated with various valves, blowers, compressors, and other equipment. Such process variable signals may be indicative of a position or state of operation of the specific pieces of equipment or indicative of the operating characteristics within the specific pieces of equipment such as flow rate, temperature, pressure, vibration frequency, density, weight, or size.

The diameter or volume of the coated particles 22 may be increased by increasing deposition rate of the second chemical species, by increasing the mechanically fluidized bed 20 depth, by reducing the number of fresh particles 92 added to the mechanically fluidized particulate bed 20 per unit time, or combinations thereof. The deposition rate of the second chemical species on the particles in the particulate bed 20 may be increased by increasing the partial pressure of the first chemical species in the bulk gas in the upper portion of the chamber 33, by increasing the rate at which the bulk gas mixture is incorporated into the mechanically fluidized particulate bed 20, by increasing the surface area of the particles in the mechanically fluidized particulate bed 20, by increasing the temperature of the mechanically fluidized particulate bed 20, or combinations thereof.

In at least some instances, increasing the temperature of the mechanically fluidized particulate bed 20 can increase the thermal decomposition rate of the first chemical species which will advantageously increase the deposition rate of the second chemical species. However, such increases in bed temperature will increase the electrical energy consumed by the heater 14 to heat the particulate bed 20 which results in a disadvantageous higher electrical usage per unit of polysilicon product (i.e., result in higher kilo-watt hours per kilogram of polysilicon produced). Hence an optimal particulate bed 20 temperature may be selected for any given system and set of operational objectives and cost factors, balancing production rate with electrical cost by adjusting the temperature of the mechanically fluidized particulate bed 20.

The control system 190 may use the various process variable signals to generate one or more control variable outputs useful for controlling one or more of the elements of the system 100 according to a defined set of machine executable instructions or logic. The machine executable instructions or logic may be stored in one or more non-transitory storage locations that are communicably coupled to the control system 190. For example, the control may produce one or more control signal outputs for controlling various elements such as valve(s), heater(s), motors, actuators or transducers, blowers, compressors, etc. Thus, for instance, the control system 190 may be communicatively coupled and configured to control one or more valves, conveyors or other transport mechanisms to selectively provide fresh particles 92 to the mechanically fluidized particulate bed 20. Also for instance, the control system 190 may be communicatively coupled and configured to control a frequency of vibration or oscillation of the pan 12 or the oscillatory or vibratory displacement of the pan 12 along the single axis of motion 54 to produce the desired level of fluidization within the particulate bed 20. The control system 190 may be communicatively coupled and configured to control a temperature of all or a portion of the pan 12 or of the mechanically fluidized particulate bed 20 contained therein. Such control may be accomplished by controlling a flow of current through the heater 14. Also for instance, the control system 190 may be communicatively coupled and configured to control a flow of the first chemical species from the reservoir 72 or one or more diluent(s) from the diluent reservoir 78 into the upper portion of the chamber 33. Such control may be accomplished using one or more variably adjustable final control elements such as control valves, solenoids, relays, actuators, valve positioners and the like or by controlling the delivery rate or pressure of one or more blowers or compressors, for example by controlling a speed of an associated electric motor. Also for instance, the control system 190 may be communicatively coupled and configured to control the withdrawal of exhaust gas from the reaction of containment vessel via the gas recovery system 110. Such control may be accomplished by providing suitable control signals including information obtained from an on-line analyzer (e.g., a gas chromatograph) monitoring the concentration of first reactant in the bulk gas mixture in the upper portion of the chamber 33, to control one or more valves, dampers, blowers, exhaust fans, via one or more solenoids, relays, electric motors or other actuators.

The control system 190 may take a variety of forms. For example, the control system 190 may include a programmed general purpose computer having one or more microprocessors and memories (e.g., RAM, ROM, Flash, rotating media). Alternatively, or additionally, the control system 190 may include a programmable gate array, application specific integrated circuit, and/or programmable logic controller.

Figure 2:
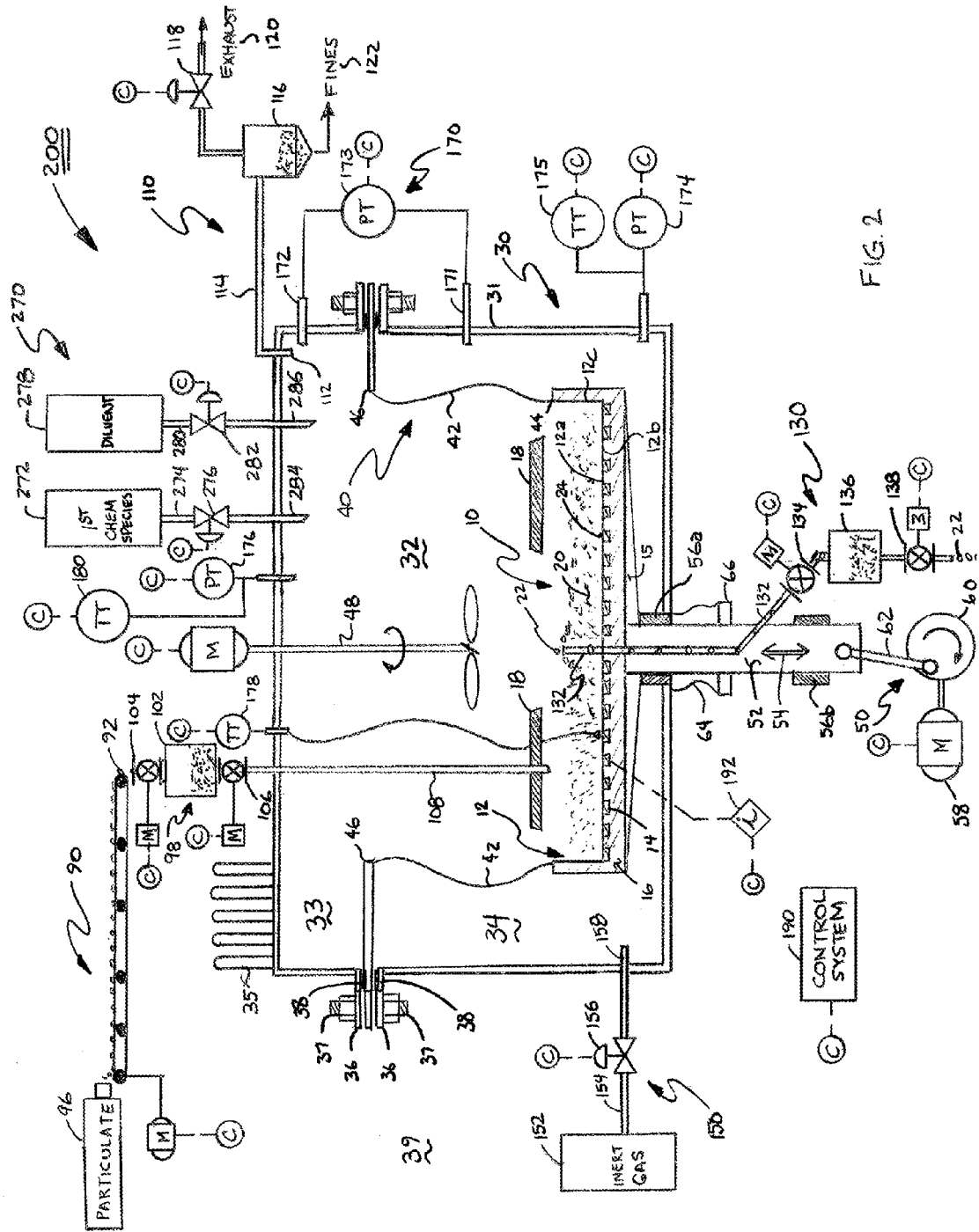
FIG. 2 is a partial sectional view of an example continuous mechanically fluidized deposition system including a housing, a particulate bed located in an upper portion of a chamber formed within the housing, a transmission system coupled to the particulate bed to mechanically fluidize the bed via oscillation or vibration along a single axis of motion, a gas supply subsystem to individually deliver a first chemical species and one or more diluent(s) to the upper portion of the chamber proximate the mechanically fluidized particulate bed, and various supply lines and output lines, according to an illustrated embodiment.

FIG. 2 shows a continuously or near-continuously operated mechanically fluidized bed reactor system 200, according to one illustrated embodiment. In the continuously operated mechanically fluidized bed reactor system 200, fresh particles 92 and quantities of a first chemical species and one or more diluent(s) may be continuously or near-continuously introduced to the upper portion 33 of the chamber 32 within the reaction vessel 30. As the bulk gas mixture permeates the mechanically fluidized particulate bed 20, the decomposition of the first chemical species within the particulate bed 20 deposits a second chemical species on the particles in the bed to form coated particles 22. Coated particles 22 may be continuously or near-continuously removed from the particulate bed via the coated particle collection subsystem 130.

Within the continuously operated mechanically fluidized bed reactor, the first chemical species and the one or more diluent(s) are added separately to the upper portion of the chamber 33 forming a bulk gas mixture therein. In such a manner, the flow and pressure of the first chemical species and the one or more diluent(s) may be individually controlled, altered, or adjusted to provide a wide range of operating environments within the upper portion of the chamber 33. The first chemical species and any diluent(s) premixed therewith are transferred from a reservoir 272 via one or more conduits 274 and one or more final control elements 276, such as one or more flow or pressure control valves. The first chemical species flows into the upper portion of the chamber 33 via one or more first chemical species inlets 284 in a controlled, safe, and environmentally conscious manner.

In a similar manner, the one or more diluent(s) are transferred from a reservoir 278 via one or more conduits 280 and one or more final control elements 282, such as one or more flow or pressure control valves. The one or more diluent(s) flow into the upper portion of the chamber 33 via one or more diluent inlets 286 in a controlled, safe, and environmentally conscious manner. In at least some operating modes, no diluent is added to the upper portion of the chamber 33.

Within the upper portion of the chamber 33, the flow or pressure of either or both the first chemical species or the one or more diluent(s) may be individually, continuously, adjusted or varied by the control system 190 to maintain any pressure within the upper portion of the chamber 33 as measured using the pressure transmitter 176. In operation, the upper portion of the chamber 33 can be maintained at a pressure of from about 5 psia (0.33 atm.) to about 300 psia (20 atm.); from about 15 psia (1 atm.) to about 220 psia (15 atm.); from about 30 psia (2 atm.) to about 185 psia (12.5 atm.); or from about 75 psia (5 atm.) to about 450 psia (30 atm.). Within the upper portion of the chamber 33, the first chemical species can be at a partial pressure of from about 15 psi (1 atm.) to about 220 psi (15 atm.); from about 15 psi (1 atm.) to about 150 psi (10 atm.); from about 15 psi (1 atm.) to about 75 psi (5 atm.); or from about 15 psi (1 atm.) to about 45 psi (3 atm.). Within the upper portion of the chamber 33, the one or more diluent(s) can be at a partial pressure of from about 15 psi (1 atm.) to about 375 psi (25 atm.); from about 15 psi (1 atm.) to about 220 psi (15 atm.); from about 15 psi (1 atm.) to about 150 psi (10 atm.); or from about 45 psi (3 atm.) to about 150 psi (10 atm.). In one continuous or near-continuous operation example, the operating pressure within the upper portion of the chamber 33 is maintained at about 165 psi (11 atm.), with the partial pressure of silane (i.e., the first chemical species) maintained at about 30 psi (2 atm.), and the partial pressure of hydrogen (i.e., the diluent) maintained at about 135 psi (9 atm.).

The flow or pressure of either or both the first chemical species and the one or more diluent(s) may be further continuously adjusted or varied using the control system 190 to maintain any gas composition within the upper portion of the chamber 33. In some situations, the concentration of the first chemical species in the gas mixture in the upper portion of the chamber 33 can range from about 5 mol % to about 50 mol %; from about 5 mol % to about 40 mol %; from about 10 mol % to about 40 mol %; from about 10 mol % to about 30 mol %; or from about 20 mol % to about 30 mol %. In some situations, the concentration of the diluent(s) in the gas mixture in the upper portion of the chamber 33 can range from about 50 mol % to about 95 mol %; from about 60 mol % to about 95 mol %; from about 60 mol % to about 90 mol %; from about 70 mol % to about 99 mol %; or from about 70 mol % to about 80 mol %.

The first chemical species is added to the upper portion of the chamber 33 via inlet 284 at a temperature below its thermal decomposition temperature. The thermal decomposition temperature and consequently the temperature at which the first chemical species is added to the upper portion of the chamber 33 is dependent on both the operating pressure of the upper portion of the chamber 33 and the first chemical species composition. In some instances, the first chemical species may be added to the upper portion of the chamber 33 at a temperature that is about 10° C. to about 500° C. less than its thermal decomposition temperature; about 10° C. to about 400° C. less than its thermal decomposition temperature; about 10° C. to about 300° C. less than its thermal decomposition temperature; about 10° C. to about 200° C. less than its thermal decomposition temperature; or about 10° C. to about 100° C. less than its thermal decomposition temperature. In other instances, the first chemical species can be added to the upper portion of the chamber 33 at a temperature of from about 50° C. to about 375° C.; about 50° C. to about 325° C.; about 50° C. to about 275° C.; about 50° C. to about 200° C.; or about 50° C. to about 125° C.

In some instances, the temperature of the feed gas containing the first chemical species and the one or more diluent(s) may be selected to maintain a desired bulk gas temperature in the upper portion of the chamber 33. In some instances, the bulk gas temperature in the upper portion of the chamber 33 is maintained below the auto-decomposition temperature of the first chemical species to reduce the likelihood of poly-powder formation within the upper portion of the chamber 33. In some instances, the bulk gas temperature in the upper portion of the chamber 33 is maintained below the auto-decomposition temperature of the first chemical species by controlling the rate of heat removal through surface features 35, or other means of surface heat removal. The upper portion of the chamber can be maintained at a temperature of less than about 500° C.; less than about 400° C., or less than about 300° C. In some instances, to reduce the power demand of the heater 14, the bulk gas in the upper portion of the chamber 33 may be maintained at the highest temperature at which substantially no poly-powder forms.

The one or more diluent(s) may be added to the upper portion of the chamber 33 via inlet 286 at a temperature that is the same as or different from the temperature of the first chemical species. In at least some instances, the one or more diluent(s) is added to the upper portion of the chamber 33 at a temperature below the decomposition temperature of the first chemical species. The thermal decomposition temperature and consequently the temperature at which the one or more diluent(s) are added to the upper portion of the chamber 33 is dependent on both the operating pressure of the upper portion of the chamber 33 and the composition of the first chemical species. In some instances, the one or more diluent(s) may be added to the upper portion of the chamber 33 at a temperature that is about 10° C. to about 500° C. less than the thermal decomposition temperature of the first chemical species; about 10° C. to about 400° C. less than the thermal decomposition temperature of the first chemical species; about 10° C. to about 300° C. less than the thermal decomposition temperature of the first chemical species; about 10° C. to about 200° C. less than the thermal decomposition temperature of the first chemical species; or about 10° C. to about 100° C. less than the thermal decomposition temperature of the first chemical species. In other instances, the one or more diluent(s) can be added to the upper portion of the chamber 33 at a temperature of from about 50° C. to about 375° C.; about 50° C. to about 325° C.; about 50° C. to about 275° C.; about 50° C. to about 200° C.; or about 50° C. to about 125° C.

In the continuous system shown in FIG. 2, the first chemical species, the one or more diluent(s) and fresh particles 92 may be added to the upper portion of the chamber 33 on a continuous or near-continuous basis. Within the mechanically fluidized particulate bed 20, the first chemical species thermally decomposes, depositing the second chemical species on the surface of the particles in the particulate bed 20. The partial pressure of the first chemical species in the upper portion of the chamber 33 in combination with the total pressure in chamber 33 and the feed rates of first chemical and diluent to chamber 33, provides an indication of the quantity of first chemical species thermally decomposed in the particulate bed 20. As the partial pressure of the first chemical species decreases in the upper portion of the chamber 33, the control system 190 may exhaust a portion of the bulk gas mixture from the upper portion of the chamber 33 on a substantially continuous basis to maintain a desired bulk gas composition in the upper portion of the chamber 33. The control system 190 may also transfer additional first chemical species from the reservoir 272 or one or more diluent(s) from the reservoir 278 to the upper portion of the chamber 33 on a substantially continuous basis to maintain a desired first chemical species partial pressure or gas composition in the upper portion of the chamber 33.

As the second chemical species builds on the surface of the particles in the particulate bed 20, the larger coated particles 22 (i.e., those having greater quantities of second chemical species disposed thereupon) will tend to "float" within, or rise to the surface of, the particulate bed 20. Coated particles 22 may overflow on a continuous or semi-continuous basis from the particulate bed 20 into the hollow member 132 for removal from the reaction vessel 30. Fresh particles 92 may be added on a substantially continuous basis by the particle conveyance subsystem 90.

The substantially continuous addition of the first chemical species to the upper portion of the chamber 33 advantageously permits the substantially continuous production of coated particles 22 and may achieve a single stage overall conversion of greater than about 50%; greater than about 55%; greater than about 60%; greater than about 65%; greater than about 70%; greater than about 75%; greater than about 80%; greater than about 85%; greater than about 90%; or greater than about 95%.

Figure 3:
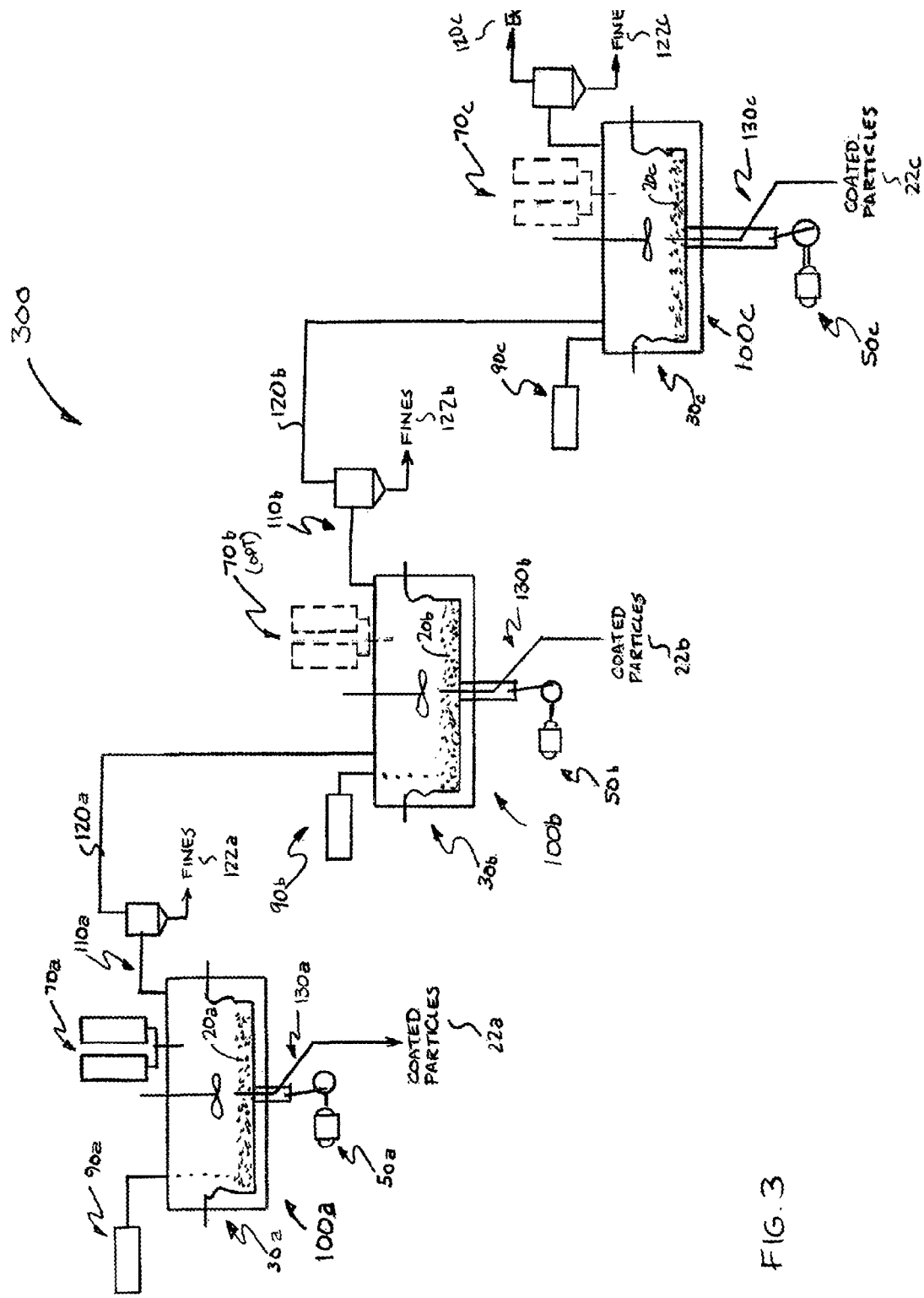
FIG. 3 is a schematic view of an example semi-batch production process including three serially coupled semi-batch reaction vessels suitable for the production of second chemical species coated particles using the example semi-batch mechanically fluidized deposition system shown in FIG. 1.

FIG. 3 shows a process useful for the production of second chemical species coated particles, for example polysilicon coated particles, using three semi-batch reaction vessels 100 shown in FIG. 1. In such an arrangement the exhaust 120a from the first reaction vessel 100a includes residual undecomposed first chemical species and one or more diluent(s). The exhaust 120a is introduced to the second semi-batch reaction vessel 100b where an additional portion of the residual first chemical species present in the exhaust 120a is thermally decomposed. The exhaust 120b from the second reaction vessel 100b includes residual undecomposed first chemical species and one or more diluent(s). The exhaust 120b is introduced to a third reaction vessel 100c where an additional portion of the residual first chemical species present in the exhaust 120b is further thermally decomposed. Advantageously, the use of such a process can provide an overall conversion of the first chemical species to the second chemical species in excess of 99%.

The first chemical species and the one or more diluent(s) are added as a bulk gas via the gas supply subsystem 70a to the first reaction vessel 100a. A portion of the first chemical species present in the bulk gas is thermally decomposed within the mechanically fluidized particulate bed 20a. The bulk gas mixture is circulated in the first reaction vessel 100a for a first time period (e.g., the first batch cycle) and then removed from the first reaction vessel 100a via the gas collection system 110a.

Coated particles 22a in the particulate bed 20a that have a diameter corresponding to a desired quantity of second chemical species are removed from the particulate bed 20a via the coated particle collection subsystem 130a that discharges the finished particles 24a from the first reaction vessel 100a. Coated particles 22a may be removed from the particulate bed 20a continuously throughout the first batch cycle, or may be removed in bulk at the end of the first batch cycle. Fresh particles 92a may be added to the particulate bed 20a by the particulate supply subsystem 90a either continuously throughout the first batch cycle or in bulk at the beginning of the first batch cycle.

In the first reaction vessel 100a, the first chemical species to second chemical species conversion can be greater than about 70%; greater than about 75%; greater than about 80%; greater than about 85%; or greater than about 90%. A portion of the bulk gas mixture is removed from the first reaction vessel 100a via the gas collection system 110a, fine particulates are separated and removed as fines 122a, and the exhaust 120a is directed to the second reaction vessel 100b.

In the second reaction vessel 100b, an optional second gas supply subsystem 70b (shown dashed in FIG. 3) may be used to provide additional first chemical species, one or more diluent(s) or a bulk gas including a mixture of both the first chemical species and one or more diluent(s). A portion of the residual first chemical species present in the exhaust 120a is thermally decomposed within the mechanically fluidized particulate bed 20b as the exhaust 120a and any added gases are circulated in the second reaction vessel 100b for a second time period (e.g., the second batch cycle). At the conclusion of the second batch cycle, the bulk gas is removed from the second reaction vessel 100b via the gas collection system 110b. The second batch cycle is typically of the same duration as the first batch cycle, although differing durations may be used.

Coated particles 22b in the particulate bed 20b that have a diameter corresponding to a desired quantity of second chemical species are removed from the particulate bed 20b via the coated particle collection subsystem 130b that discharges the finished coated particles 22b from the second reaction vessel 100b. Coated particles 22b may be removed from the particulate bed 20a continuously throughout the second batch cycle, or may be removed in bulk at the end of the second batch cycle. Fresh particles 92b may be added to the particulate bed 20b by the second particulate supply subsystem 90b either continuously throughout the second batch cycle or in bulk at the beginning of the second batch cycle.

The first chemical species to second chemical species conversion in the second reaction vessel 100b can be greater than about 70%; greater than about 75%; greater than about 80%; greater than about 85%; or greater than about 90%. The overall conversion through the first and second reaction vessels 100a, 100b can be greater than about 90%; greater than about 92%; greater than about 94%; greater than about 96%; greater than about 98%; greater than about 99%. A portion of the gas mixture is removed from the second reaction vessel 100b via the gas collection system 110b, fine particulates are separated and removed as fines 122b, and the exhaust 120b is directed to the third reaction vessel 100c.

In the third reaction vessel 100c, an optional third gas supply subsystem 70c (shown dashed in FIG. 3) may be used to provide additional first chemical species, one or more diluent(s) or a bulk gas including a mixture of both the first chemical species and one or more diluent(s). A portion of the residual first chemical species present in the exhaust 120b is further thermally decomposed within the mechanically fluidized particulate bed 20c as the exhaust 120b and any added gases are circulated in the third reaction vessel 100c for a third time period (e.g., the third batch cycle). At the conclusion of the third batch cycle, the bulk gas is removed from the third reaction vessel 100c via the gas collection system 110c. The third batch cycle is typically of the same duration as the first and second batch cycles, although differing durations for one or more batch cycles may be used.

Coated particles 22c in the particulate bed 20c that have a diameter corresponding to a desired quantity of second chemical species are removed from the particulate bed 20c via the coated particle collection subsystem 130c that discharges the finished coated particles 22c from the third reaction vessel 100c. Coated particles 22c may be removed from the particulate bed 20c continuously throughout the third batch cycle, or may be removed in bulk at the end of the third batch cycle. Fresh particles 92c may be added to the particulate bed 20c by the third particulate supply subsystem 90c either continuously throughout the third batch cycle or in bulk at the beginning of the third batch cycle.

In the third reaction vessel 100c, the first chemical species to second chemical species conversion can be greater than about 70%; greater than about 75%; greater than about 80%; greater than about 85%; or greater than about 90%. The overall conversion through the first, second, and third reaction vessels 100a, 100b, 100c can be greater than about 94%; greater than about 96%; greater than about 98%; greater than about 99%; greater than about 99.5%; or greater than about 99.9%. The gas mixture is removed from the third reaction vessel 100c via the gas collection system 110c, fine particulates are separated and removed as fines 122c, and the exhaust 120c, which is nearly 100% diluent, is treated, recycled, or discharged.

Figure 4:
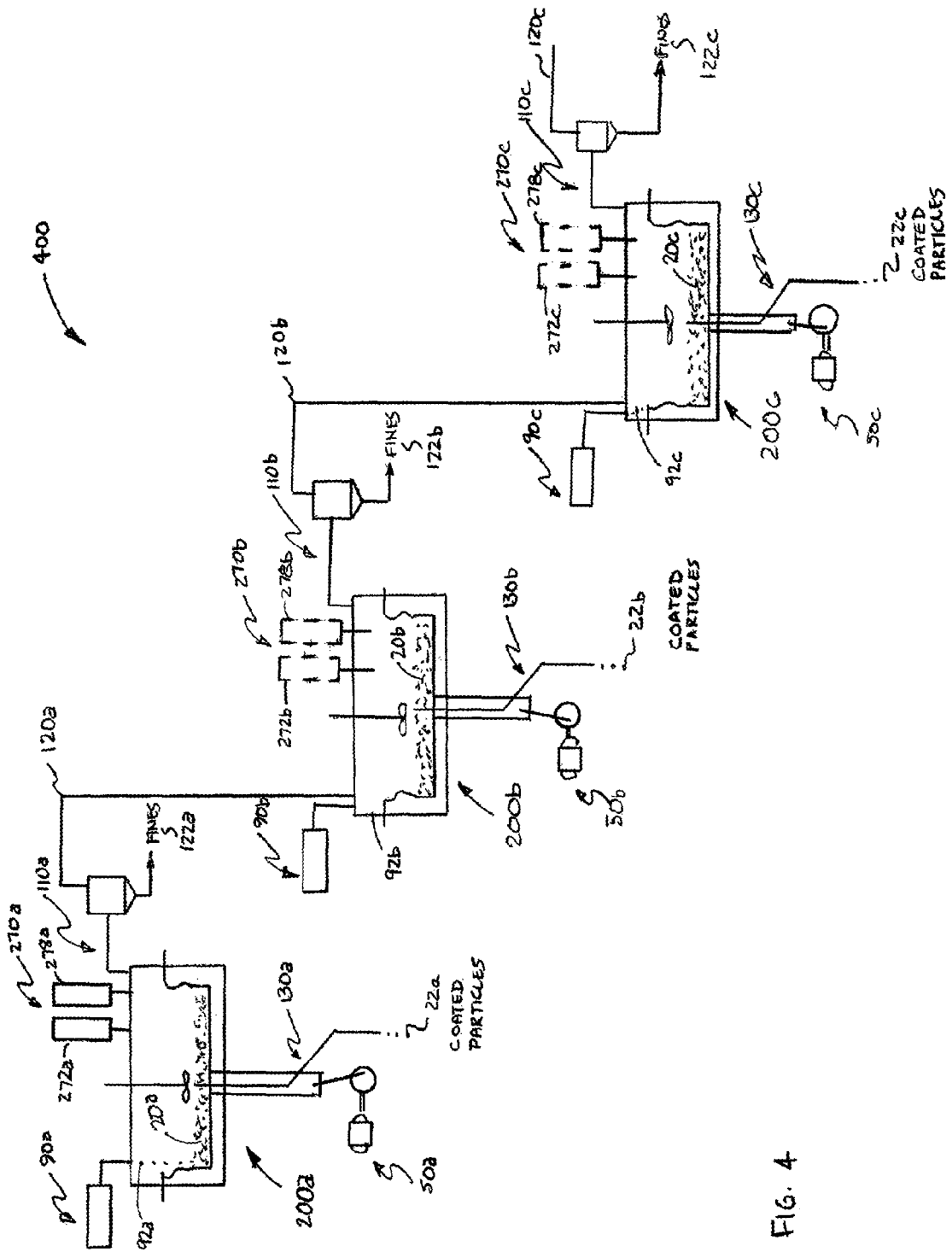
FIG. 4 is a schematic view of an example continuous production process including three serially coupled continuous reaction vessels suitable for the production of second chemical species coated particles using the example continuous mechanically fluidized deposition system shown in FIG. 2.

FIG. 4 shows a process useful for the production of second chemical species coated particles, for example polysilicon coated particles, using three continuous reaction vessels 200 as shown in FIG. 2 and described in detail therewith. In such an arrangement the exhaust 120a from the first reaction vessel 200a includes residual undecomposed first chemical species and one or more diluent(s). The exhaust 120a is introduced to the second reaction vessel 200b where an additional portion of the residual first chemical species present in the exhaust 120a is thermally decomposed. The exhaust 120b from the second reaction vessel 200b includes residual undecomposed first chemical species and one or more diluent(s). The exhaust 120b is introduced to a third reaction vessel 200c where an additional portion of the residual first chemical species present in the exhaust 120b is thermally decomposed.

The first chemical species (e.g. silane or chlorosilane) and the one or more diluent(s) (e.g., hydrogen) are individually transferred on a substantially continuous basis to the first reaction vessel 200a from reservoirs 272a and 278a, respectively. A portion of the first chemical species added to the first reaction vessel 200a is thermally decomposed within the mechanically fluidized particulate bed 20a. The first chemical species and the one or more diluent(s) are removed on a substantially continuous basis from the first reaction vessel 200a via the gas collection subsystem 110a. Thus, in contrast to the semi-batch process 300, in the continuous process 400, the first chemical species and the one or more diluent(s) flow substantially continuously through the first reaction vessel 200a.

Coated particles 22a in the particulate bed 20a that have a diameter corresponding to a desired quantity of second chemical species (e.g., polysilicon) are removed from the particulate bed 20a via the coated particle collection subsystem 130a that discharges the finished coated particles 22a from the first reaction vessel 200a. Coated particles 22a are removed from the particulate bed 20a on a substantially continuous basis. Fresh particles 92a are added to the particulate bed 20a by the particulate supply subsystem 90a on a substantially continuous basis to maintain a target particulate bed 20a thickness in the first reaction vessel 200a.

In the first reaction vessel 200a, the first chemical species to second chemical species conversion can be greater than about 50%; greater than about 60%; greater than about 70%; greater than about 80%; or greater than about 90%. The residual first chemical species (i.e., the portion of the first chemical species not thermally decomposed in the first reaction vessel 200a) and the one or more diluent(s) exit the first reaction vessel 200a as an exhaust 120a via the gas collection system 110a. The gas collection subsystem 110a separates and removes fines 122a from the first chemical species and the one or more diluent(s) prior to their introduction to the second reaction vessel 200b.

In the second reaction vessel 200b, a portion of the residual first chemical species present in the exhaust 120a is thermally decomposed within the mechanically fluidized particulate bed 20b. An optional second gas supply subsystem 270b (shown dashed in FIG. 4) may be used to individually provide additional first chemical species or one or more diluent(s) to the second reaction vessel 200b.

Coated particles 22b in the particulate bed 20b that have a diameter corresponding to a desired quantity of second chemical species are removed from the particulate bed 20b via the coated particle collection subsystem 130b that discharges the finished coated particles 22b from the second reaction vessel 200b. Coated particles 22b are removed from the particulate bed 20b on a substantially continuous basis. Fresh particles 92b are added to the particulate bed 20b by the particulate supply subsystem 90b on a substantially continuous basis to maintain a target particulate bed 20b thickness in the second reaction vessel 200b. The target particulate bed 20b thickness in the second reaction vessel 200b may or may not be the same as the target particulate bed 20a thickness in the first reaction vessel 200a.

In the second reaction vessel 200b, the first chemical species to second chemical species conversion can be greater than about 50%; greater than about 60%; greater than about 70%; greater than about 80%; or greater than about 90%. The overall conversion through the first and second reaction vessels 200a, 200b can be greater than about 75%; greater than about 80%; greater than about 85%; greater than about 90%; or greater than about 95%. The residual first chemical species (i.e., the portion of the first chemical species not thermally decomposed in the second reaction vessel 200b) and the one or more diluent(s) exit the second reaction vessel 200b as an exhaust 120b via the gas collection system 110b. The gas collection subsystem 110b separates and removes fines 122b from the first chemical species and the one or more diluent(s) prior to their introduction to the third reaction vessel 200c.

In the third reaction vessel 200c, a portion of the residual first chemical species present in the exhaust 120b is thermally decomposed within the mechanically fluidized particulate bed 20c. An optional third gas supply subsystem 270c (shown dashed in FIG. 4) may be used to individually provide additional first chemical species or one or more diluent(s) to the third reaction vessel 200c.

Coated particles 22c in the particulate bed 20c that have a diameter corresponding to a desired quantity of second chemical species are removed from the particulate bed 20c via the coated particle collection subsystem 130c that discharges the finished coated particles 22c from the third reaction vessel 200c. Coated particles 22c are removed from the particulate bed 20c on a substantially continuous basis. Fresh particles 92c are added to the particulate bed 20c by the particulate supply subsystem 90c on a substantially continuous basis to maintain a target particulate bed 20c thickness in the third reaction vessel 200c. The target particulate bed 20c thickness in the third reaction vessel 200c may or may not be the same as the target particulate bed 20a, 20b thicknesses in the first and second reaction vessels 200a, 200b. In an alternate operational mode, all or a portion of particles 22c may be added to reactor 200b together with or instead of fresh particles 92b; and all or a portion of particles 22b may be added to reactor 200a together with or instead of fresh particles 92a.

In the third reaction vessel 200c, the first chemical species to second chemical species conversion can be greater than about 50%; greater than about 60%; greater than about 70%; greater than about 80%; or greater than about 90%. The overall conversion through the first and second reaction vessels 200a, 200b can be greater than about 85%; greater than about 90%; greater than about 95%; greater than about 97%; or greater than about 99%. The residual first chemical species (i.e., the portion of the first chemical species not thermally decomposed in the third reaction vessel 200c) and the one or more diluent(s) exit the third reaction vessel 200c as an exhaust 120c via the gas collection system 110c. Fine particulates are separated and removed as fines 122c from the exhaust 120c, and the exhaust 120c is treated or recycled.

EXAMPLE

A gas comprising a first chemical species of 99%+ silane gas ($SiH_4$) and a diluent comprising 99%+ hydrogen at a temperature of approximately 200° C. and a pressure of approximately 175 psig are introduced to the upper portion of the chamber 33. An inert gas comprising 99%+ nitrogen is introduced at a temperature of approximately 50° C. and a pressure of approximately 176 psig to the lower portion of the chamber 34. The partial pressure of the silane within the upper portion of the chamber 204 is maintained at approximately 30 psig (2 atm.) and the partial pressure of the hydrogen within the upper portion of the chamber 204 is maintained at approximately 135 psig (9 atm.). The composition of the gas mixture in the upper portion of the chamber 33 is about 18 mol % silane and about 82 mol % hydrogen. The system is operated continuously and the gas mixture in the upper portion of the chamber 204 is circulated using a fan 48.

The pan 12 has a diameter of approximately 35 inches and an upper surface 12a having a surface area of approximately 960 in². The reaction vessel 104 has a diameter of approximately 42 inches. The pan is vibrated at a frequency of approximately 2500 Hz with an oscillatory displacement along the single axis of motion 54 of approximately 0.1 inches.

Fresh particulates 92 including silicon beads having an average diameter of approximately 0.25 mm are added via the particulate supply subsystem 90 to the pan 12, forming a particulate bed 20 having a settled depth of approximately 1 inch therein. The vibration of the pan 12 along the single axis of motion 54 fluidizes and circulates the particulate bed 20 within the pan 12. The height of the particles in the mechanically fluidized particulate bed 20 rises about 40% during fluidization, compared to its settled height. Using the heater 14, the mechanically fluidized particulate bed 20 is heated to a bulk temperature in excess of 450° C. at which point the silane thermally decomposes to deposit polysilicon on the particles within the mechanically fluidized particulate bed 20. The thermal decomposition rate of the silane within the mechanically fluidized particulate bed 20 can be adjusted, controlled or affected by adjusting the temperature of the mechanically fluidized particulate bed 20 or the pressure within the upper portion of the chamber 33 containing the silane and the mechanically fluidized particulate bed 20, or the partial pressure of the silane within the upper portion of the chamber 33 containing the silane and the mechanically fluidized particulate bed 20.

The particle feed rate is maintained at approximately 45 particles/min-in² of the pan surface area or a total of approximately 43,200 particles/minute added to the particulate bed 20. The volumetric transfer rate of the bulk gas mixture above the mechanically fluidized particulate bed 20 into the mechanically fluidized particulate bed 20 is maintained, by adjusting operating parameters comprising total pressure in chamber 33, or the gas circulator 48, or the vibration or oscillation speed of the mechanically fluidized bed 20, at approximately 0.25 liters/min-in² or a total of approximately 240 liters per minute. At these conditions, the silane conversion rate is approximately 70% and approximately 140 MTA of 1.6 mm diameter polysilicon coated particles are produced.

The systems and processes disclosed and discussed herein for the production of silicon have marked advantages over systems and processes currently employed. The systems and processes are suitable for the production of either semiconductor grade or solar grade silicon. The use of high purity silane as the first chemical species in the production process allows a high purity silicon to be produced more readily. The system advantageously maintains the silane at a temperature below the 400° C. thermal decomposition temperature until the silane enters the mechanically fluidized particulate bed. By maintaining temperatures outside of the mechanically fluidized particulate bed below the thermal decomposition temperature of silane, the overall conversion of silane to usable polysilicon deposited on the particles within the mechanically fluidized particulate bed is increased and parasitic conversion losses attributable to decomposition of silane and deposition of polysilicon on other surfaces within the reactor is minimized.

The mechanically fluidized bed systems and methods described herein greatly reduce or eliminate the formation of ultra-fine poly-powder (e.g., 0.1 micron in size) since the temperature of the gas containing the first chemical species is maintained below the auto-decomposition temperature of the first chemical species. Additionally, the temperature within the chamber 32 is also maintained below the auto-decomposition temperature of the first chemical species further reducing the likelihood of auto-decomposition. Further, any small particles formed in the mechanically fluidized bed, by abrasion, physical damage or attrition for example, generally having a diameter significantly greater than 0.1 micron, but less than 250 microns are carried out of the chamber 32 with the exhaust gas. These small particles are far less subject to electrostatic forces and can be efficiently removed from the exhaust gas. As a result, the formation of product particles having a desirable size distribution is more readily achieved.

Silane also provides advantages over dichlorosilane, trichlorosilane, and tetrachlorosilane for use in making high purity polysilicon. Silane is much easier to purify and has fewer contaminants than dichlorosilane, trichlorosilane, or tetrachlorosilane. Because of the relatively low boiling point of silane, it can be readily purified which reduces the tendency to entrain contaminants during the purification process as occurs in the preparation and purification of dichlorosilane, trichlorosilane, or tetrachlorosilane. Further, certain processes for the production of trichlorosilane utilize carbon or graphite, which may carry along into the product or react with chlorosilanes to form carbon-containing compounds. Further, the silane-based decomposition process such as that described herein produces only a hydrogen by-product. The hydrogen byproduct may be directly recycled to the silane production process, reducing or eliminating the need for an off-gas treatment system. The elimination of off-gas treatment and the efficiencies of the mechanically fluidized bed process greatly reduce capital and operating cost to produce polysilicon. Savings of 40% in each are possible.

The above description of illustrated embodiments, including what is described in the Abstract, is not intended to be exhaustive or to limit the embodiments to the precise forms disclosed. Although specific embodiments and examples are described above for illustrative purposes, various equivalent modifications can be made without departing from the spirit and scope of the disclosure, as will be recognized by those skilled in the relevant art. The teachings provided above of the various embodiments can be applied to other systems, methods and/or processes for producing silicon, not only the exemplary systems, methods and devices generally described above.

For instance, the detailed description above has set forth various embodiments of the systems, processes, methods and/or devices via the use of block diagrams, schematics, flow charts and examples. Insofar as such block diagrams, schematics, flow charts and examples contain one or more functions and/or operations, it will be understood by those skilled in the art that each function and/or operation within such block diagrams, schematics, flowcharts or examples can be implemented, individually and/or collectively, by a wide range of system components, hardware, software, firmware, or virtually any combination thereof.

In certain embodiments, the systems used or devices produced may include fewer structures or components than in the particular embodiments described above. In other embodiments, the systems used or devices produced may include structures or components in addition to those described herein. In further embodiments, the systems used or devices produced may include structures or components that are arranged differently from those described herein. For example, in some embodiments, there may be additional heaters and/or mixers and/or separators in the system to provide effective control of temperature, pressure, or flow rate. Further, in implementation of procedures or methods described herein, there may be fewer operations, additional operations, or the operations may be performed in different order from those described herein. Removing, adding, or rearranging system or device components, or operational aspects of the processes or methods, would be well within the skill of one of ordinary skill in the relevant art in light of this disclosure.

The operation of methods and systems for making polysilicon described herein may be under the control of automated control subsystems. Such automated control subsystems may include one or more of appropriate sensors (e.g., flow sensors, pressure sensors, temperature sensors), actuators (e.g., motors, valves, solenoids, dampers), chemical analyzers and processor-based systems which execute instructions stored in processor-readable storage media to automatically control the various components and/or flow, pressure and/or temperature of materials based at least in part on data or information from the sensors, analyzers and/or user input.

Regarding control and operation of the systems and processes, or design of the systems and devices for making polysilicon, in certain embodiments the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof. Accordingly, designing the circuitry and/or writing the code for the software and or firmware would be well within the skill of one of ordinary skill in the art in light of this disclosure.

The various embodiments described above can be combined to provide further embodiments. Aspects of the embodiments can be modified, if necessary to employ concepts of various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A reactor, comprising:
a housing having a chamber therein;
a flexible membrane that apportions the chamber in the housing into an upper chamber and a lower chamber, the lower chamber hermetically sealed from the upper chamber;
a pan received in the upper chamber of the housing, the pan including a bottom having a lower surface, an upper surface and a perimeter; and, a perimeter wall that extends upward relative to the bottom of the pan;
a transmission that, in operation, mechanically vibrates a plurality of particulates carried by at least a portion of the upper surface of the bottom of the pan as a particulate bed by oscillating the pan along at least a vertical axis; and
an electric heater positioned at or below the upper surface of the pan which supports the particulate bed in operation, the electric heater at least one of thermally conductively or thermally radiantly coupled to the pan, such that, in operation, the electric heater raises the temperature of the particulate bed via the pan above a thermal decomposition temperature of a first gaseous chemical species to thermally decompose the first gaseous chemical species and deposit a non-volatile second chemical species on at least a portion of the plurality of particulates to provide a plurality of coated particles while a temperature in at least a portion of the upper chamber spaced above the particulate bed is maintained at less than the thermal decomposition temperature of the first gaseous chemical species.

2. The reactor of claim 1 wherein the vertical axis is perpendicular to the bottom of the pan, and further comprising:
at least one bushing having an aperture passing therethrough.

3. The reactor of claim 2 wherein the transmission has at least one transmission member passing through the aperture in the at least one bushing such that the at least one bushing constrains the at least one transmission member to the vertical axis perpendicular to the bottom of the pan.

4. The reactor of claim 2 wherein the at least one bushing comprises: a first bushing having a first bushing passage and a second bushing having a second bushing passage, the second bushing passage axially aligned with the first bushing passage, and the second bushing spaced relatively apart from the first bushing.

5. The reactor of claim 4, further comprising:
a boot that surrounds at least one of the first or the second bushings.

6. The reactor of claim 1 wherein the pan comprises a pan having a circular geometry, a rectangular geometry, an oval geometry, a trapezoidal geometry, a polygonal geometry, or combinations thereof.

7. The reactor of claim 1 wherein the electric heater comprises a resistive heating element sealed within the chamber of the housing and proximate the lower surface of the bottom of the pan.

8. The reactor of claim 7 wherein the resistive heating element is at least partially enclosed by insulation; and
wherein the portion of the lower surface of the bottom of the pan proximate the heater is uninsulated, such that in operation, at least a portion of a thermal energy output of the heater is transferred through the pan to the particulate bed carried by the upper surface of the bottom of the pan.

9. The reactor of claim 1 wherein the pan further comprises:
a number of stiffening members physically coupled to the bottom of the pan.

10. The reactor of claim 9 wherein the number of stiffening members are physically coupled to the lower surface of the bottom of the pan.

11. The reactor of claim 1, further comprising:
a gas distributor including at least one gas outlet that, in operation, discharges the first gaseous chemical species into the particulate bed carried by the upper surface of the bottom of the pan.

12. The reactor of claim 1, further comprising:
a hollow member that, in operation, receives at least a portion of the plurality of coated particles from the particulate bed, the hollow member penetrating the pan bottom and extending above the pan bottom.

13. The reactor of claim 12 wherein the hollow member extends a fixed distance above the upper surface of the bottom of the pan.

14. The reactor of claim 12 wherein the hollow member extends a variable distance above the upper surface of the bottom of the pan; and
wherein an actuator operably coupled to the hollow member varies the distance the hollow member extends above the upper surface of the bottom of the pan.

15. The reactor of claim 12, further comprising:
a particle receiver that, in operation, receives at least a portion of the plurality of coated particles, the particle receiver fluidly coupled to the hollow member.

16. The reactor of claim 1 wherein
the flexible membrane has a first continuous edge and a second continuous edge disposed laterally across the flexible membrane from the first continuous edge,
the first continuous edge of the flexible membrane is physically coupled to the housing, to form a gas-tight seal therebetween,
the second continuous edge of the flexible membrane is physically coupled to the pan to form a gas-tight seal therebetween,
a physical coupling of the first and second continuous edges with the housing and the pan, respectively, forming the upper chamber and the lower chamber and in concert with the pan providing a gas-tight seal between the upper chamber and the lower chamber,
the upper chamber includes at least a portion of the upper surface of the bottom of the pan and excludes any of the lower surface of the bottom of the pan, and
the lower chamber includes at least a portion of the lower surface of the bottom of the pan and excludes any of the upper surface of the bottom of the pan.

17. The reactor of claim 16, further comprising:
a gas distributor including at least one gas outlet that, in operation, discharges the first gaseous chemical species into the particulate bed carried by the upper surface of the pan bottom.

18. The reactor of claim 16 wherein the flexible membrane comprises a flexible bellows.

19. The reactor of claim 16 wherein a pressure in the upper chamber is maintained at a first pressure level, a pressure in the lower chamber is maintained at second pressure level, and the difference between the first pressure level and the second pressure level is maintained below a defined maximum operating differential pressure of the flexible bellows.

20. The reactor of claim 17, further comprising:
a control system executing one or more sets of machine readable instructions to provide a defined conversion of the first gaseous chemical species to the non-volatile second chemical species, the control system providing one or more control outputs to final control elements that adjust at least one of:
an operating temperature of the particulate bed;
a pressure in the upper chamber of the housing;
an addition rate of the first gaseous chemical species to the particulate bed; and
a mole fraction of the first gaseous chemical species present in a gas fed to the upper chamber of the housing.

21. The reactor of claim 1 wherein the pan comprises a pan having a continuous bottom without apertures.

22. A reactor system, comprising:
a housing having a chamber therein;
a flexible membrane that apportions the chamber in the housing into an upper chamber and a lower chamber, the lower chamber hermetically sealed from the upper chamber;
a pan received in the upper chamber of the housing, the pan including: a bottom having a lower surface, an upper surface, a perimeter; and a perimeter wall that extends upward relative to the upper surface and at least partially about the perimeter of the bottom of the pan;
a transmission operably coupled to the pan that, in operation, oscillates the pan to mechanically vibrate a plurality of particulates carried by at least a portion of the upper surface of the bottom of the pan as a particulate bed;
a member having a peripheral edge, the member disposed above the bottom of the pan, with the peripheral edge of the member spaced inwardly of the perimeter wall of the pan with a peripheral gap defined between the peripheral edge of the member and the peripheral wall of the pan; and
an electric heater positioned at or below the upper surface of the pan which supports the particulate bed in operation, the electric heater at least one of thermally conductively or thermally radiantly coupled to the pan, such that, in operation, the electric heater causes a temperature of the particulate bed to increase via the pan above a thermal decomposition temperature of a first gaseous chemical species present in the particulate bed to thermally decompose the first gaseous chemical species to at least a non-volatile second chemical species that deposits on at least a portion of the plurality of particulates in the particulate bed to provide a plurality of coated particles and an inert third gaseous chemical species byproduct that exits the pan into the chamber of the housing via the peripheral gap while a temperature in at least a portion of the upper chamber spaced above the particulate bed is maintained at less than the thermal decomposition temperature of the first gaseous chemical species.

23. The reactor system of claim 22 wherein the member comprises a member disposed parallel to the upper surface of the bottom of the pan.

24. The reactor of claim 22 wherein the member separates an interior of the pan from the chamber of the housing.

25. The reactor of claim 22 wherein the member comprises a thermally reflective member that, in operation, reflects at least a portion of the thermal energy emitted by the particulate bed back to the particulate bed.

26. The reactor of claim 22 wherein the peripheral gap is an annular peripheral gap.

27. The reactor of claim 22 wherein
the flexible membrane has a first continuous edge and a second continuous edge disposed laterally across the flexible membrane from the first continuous edge;
the first continuous edge of the flexible membrane is physically coupled to the housing, to form a gas-tight seal therebetween;
the second continuous edge of the flexible membrane is physically coupled to the pan to form a gas-tight seal therebetween;
a physical coupling of the first and second continuous edges with the housing and the pan, respectively, forming the upper chamber and the lower chamber and in concert with the pan providing a gas-tight seal between the upper chamber and the lower chamber;
the upper chamber includes at least a portion of the upper surface of the bottom of the pan and excludes any of the lower surface of the bottom of the pan; and
the lower chamber includes at least a portion of the lower surface of the bottom of the pan and excludes any of the upper surface of the bottom of the pan.

28. The reactor of claim 27 wherein the member separates an interior of the pan from the upper chamber of the housing.

29. The reactor of claim 27 wherein the member comprises a thermally reflective member that, in operation, reflects at least a portion of the thermal energy emitted by the particulate bed back to the particulate bed.

30. The reactor of claim 27 wherein the electric heater comprises a resistive heating element sealed by the lower chamber of the housing and disposed proximate the pan.

31. The reactor of claim 30 wherein the resistive heating element disposed proximate the pan is at least partially enclosed by insulation; and
wherein the portion of the pan proximate the electric heater is uninsulated, such that in operation, at least a portion of a thermal energy output of the electric heater is transferred through the pan to the particulate bed carried by the upper surface of the bottom of the pan.

32. The reactor of claim 22 wherein the electric heater comprises a resistive heating element sealed by the chamber of the housing and disposed proximate the pan.

33. The reactor of claim 32 wherein the resistive heating element disposed proximate the pan is at least partially enclosed by insulation; and
wherein the portion of the pan proximate the electric heater is uninsulated, such that in operation, at least a portion of a thermal energy output of the electric heater is conductively transferred through the pan to the mechanically fluidized particulate bed carried by the upper surface of the bottom of the pan.

34. The reactor of claim 22 wherein the pan further comprises:
a number of stiffening members physically coupled to the bottom of the pan.

35. The reactor of claim 22 wherein the pan further comprises:
a number of stiffening members physically coupled to the lower surface of the bottom of the pan.

36. The reactor of claim 22 wherein the pan comprises a pan having a circular geometry, a rectangular geometry, an oval geometry, a trapezoidal geometry, a polygonal geometry, or combinations thereof.

37. A method of operating a reactor, the method comprising:
introducing a plurality of particulates to a volume, the volume defined by a pan received in an upper chamber and further defined by a member that overlies the pan, the pan having at least a bottom having an upper surface and a lower surface and a perimeter wall extending upwardly from the bottom, the perimeter wall having a top, and the member having a peripheral edge, the member disposed above the bottom of the pan, with the peripheral edge of the member spaced inward of the perimeter wall of the pan with a peripheral gap defined by the peripheral edge of the member and the peripheral wall of the pan, the upper chamber defined by a housing having a chamber therein and further defined by a flexible membrane apportioning the chamber in the housing into the upper chamber and a lower chamber, the upper chamber hermetically sealed from the lower chamber;

oscillating the pan along an axis perpendicular to the bottom of the pan such that, in operation, the plurality of particulates carried by the upper surface of the pan bottom is vibrated as a particulate bed;

heating, via the pan by an electric heater positioned at or below the upper surface of the pan which supports the particulate bed in operation such that in operation the electric heater is at least one of thermally conductively or thermally radiantly coupled to the pan, the particulate bed to a temperature in excess of a thermal decomposition temperature of a first gaseous chemical species, the first gaseous chemical species comprises of a gas that thermally decomposes to at least a non-volatile second chemical species and an inert third gaseous chemical species byproduct while a temperature in at least a portion of the upper chamber spaced above the particulate bed is maintained at less than the thermal decomposition temperature of the first gaseous chemical species;

passing the first gaseous chemical species through at least a portion of the particulate bed to deposit the non-volatile second chemical species on at least a portion of the plurality of particulates in the particulate bed; and allowing at least a portion of the inert third gaseous chemical species byproduct to exit the particulate bed toward a particle receiver positioned lower than the top of the perimeter wall of the pan.

38. The method of claim 37 wherein introducing a plurality of particulates to a volume defined by a pan comprises:

thermally decomposing at least a portion of the first gaseous chemical species in the particulate bed to form in situ self-nucleated, non-volatile second chemical species seeds that, in operation, provide at least a portion of the plurality of particulates introduced to the volume.

39. The method of claim 37 wherein introducing a plurality of particulates to a volume defined by a pan comprises:

thermally decomposing at least a portion of the first gaseous chemical species in the particulate bed to form in-situ self-nucleated, non-volatile second chemical species seeds that, in operation, provide all of the plurality of particulates introduced to the volume.

40. A reactor system, comprising:

a housing having a chamber therein;

a flexible membrane that apportions the chamber in the housing into an upper chamber and a lower chamber, the lower chamber hermetically sealed from the upper chamber;

a pan received in the upper chamber of the housing, the pan including a bottom having a lower surface, an upper surface and a perimeter; and, a perimeter wall that extends upward relative to the bottom of the pan;

a transmission physically coupled to the pan to mechanically vibrate a plurality of particulates carried by at least a portion of the upper surface of the bottom of the pan as a particulate bed;

an electric heater positioned at or below the upper surface of the pan which supports the particulate bed in operation, the electric heater thermally coupled to the pan that, in operation, transfers thermal energy to the particulate bed to thermally decompose a first gaseous chemical species in the particulate bed and deposit a non-volatile second chemical species on at least a portion of the particulates in the particulate bed to form a plurality of coated particles in the particulate bed while a temperature in at least a portion of the upper chamber spaced above the particulate bed is maintained at less than the thermal decomposition temperature of the first gaseous chemical species; and a gas distributor having an outlet port that, in operation, discharges the first gaseous chemical species into at least a portion of the particulate bed.

41. The reactor system of claim 40 wherein the electric heater is physically proximate and thermally coupled to the bottom of the pan.

42. The reactor system of claim 40 wherein the pan comprises a continuous bottom; and wherein the gas distributor outlet port is disposed above the continuous bottom of the pan.

43. The reactor system of claim 42 wherein the gas distributor and the outlet port are proximate the continuous bottom of the pan.

44. The reactor system of claim 40 wherein the heater is positioned a distance above the particulate bed such that, in operation, the heater transfers thermal energy to the particulate bed.

45. A method of operating a reactor, the method comprising:

introducing a plurality of particulates to a volume defined by a pan received in an upper chamber and that includes at least a bottom having an upper surface and a lower surface and a perimeter wall extending upwardly from the bottom of the pan and further defined by a member having a peripheral edge, the member disposed above the bottom of the pan, the upper chamber defined by a housing having a chamber therein and further defined by a flexible membrane apportioning the chamber in the housing into the upper chamber and a lower chamber, the upper chamber hermetically sealed from the lower chamber;

oscillating the pan along an axis perpendicular to the bottom of the pan such that, in operation, the plurality of particulates carried by the upper surface of the pan bottom is vibrated as a particulate bed;

heating, via the pan by an electric heater thermally coupled to the pan and positioned at or below the upper surface of the pan which supports the particulate bed in operation, the particulate bed to a temperature in excess of a thermal decomposition temperature of a first gaseous chemical species while a temperature in at least a portion of the upper chamber spaced above the particulate bed is maintained at less than the thermal decomposition temperature of the first gaseous chemical species; and discharging the first gaseous chemical species through an outlet that, in operation, is positioned subsurface in the particulate bed, the first gaseous chemical species discharging directly into at least a portion of the particulate bed, the first gaseous chemical species which comprises a gas that thermally decomposes to at least a non-volatile second chemical species, at least a portion of which deposits on at least a portion of the plurality of particulates in the particulate bed to provide a plurality of coated particles.

46. The method of claim 45 wherein discharging the first gaseous chemical species through an outlet comprises:
flowing the first gaseous chemical species through a distribution header that is physically coupled to the upper surface of the bottom of the pan, the distribution header including the outlet.

47. The method of claim 45 wherein the electric heater is positioned a distance from the particulate bed.

48. A reactor system, comprising:
a housing having a chamber therein;
a flexible membrane that apportions the chamber in the housing into an upper chamber and a lower chamber, the lower chamber hermetically sealed from the upper chamber;
a pan received in the upper chamber of the housing, the pan including a bottom having a lower surface, an upper surface and a perimeter; and, a perimeter wall that extends upward relative to the bottom of the pan;
a transmission that, in operation, oscillates the pan along an axis perpendicular to the bottom of the pan to mechanically vibrate a plurality of particulates carried on the upper surface of the bottom of the pan as a particulate bed;
an electric heater positioned at or below the upper surface of the pan which supports the particulate bed in operation, the electric heater at least one of thermally conductively or thermally radiantly coupled to the pan, such that, in operation, the electric heater provides heat via the pan to the upper surface of the bottom of the pan to transfer thermal energy to the particulate bed to thermally decompose a first gaseous chemical species and deposit a non-volatile second chemical species on at least a portion of the plurality of particulates to form a plurality of coated particles in the particulate bed; and
a hollow member having an inlet, a passage and an open distal end, the hollow member penetrating the pan bottom and extending above the pan bottom such that, in operation, the hollow member collects at the inlet at least a portion of the plurality of coated particles which flow through the hollow member to the distal end of the hollow member.

49. The reactor system of claim 48, further comprising:
a product receiver fluidly coupled to the distal end of the hollow member, the product receiver to receive the portion of the plurality of coated particles removed from the particulate bed via the hollow member.

* * * * *